United States Patent
Peterson et al.

(10) Patent No.: US 7,271,751 B2
(45) Date of Patent: Sep. 18, 2007

(54) DIGITAL BIST TEST SCHEME FOR ADC/DAC CIRCUITS

(75) Inventors: LuVerne Peterson, San Diego, CA (US); Jonathan A. Levi, Fallbrook, CA (US); Paul Abelovski, Escondido, CA (US); Roger Mar, San Diego, CA (US)

(73) Assignee: Toshiba America Electronic Components, Inc., San Diego, CA (US)

( * ) Notice: Subject to any disclaimer, the term of this patent is extended or adjusted under 35 U.S.C. 154(b) by 0 days.

(21) Appl. No.: 11/350,227

(22) Filed: Feb. 8, 2006

(65) Prior Publication Data

US 2007/0182612 A1    Aug. 9, 2007

(51) Int. Cl.
*H03M 1/10*    (2006.01)
(52) U.S. Cl. ........................ 341/120; 324/763
(58) Field of Classification Search ............... 341/118, 341/120; 324/537, 607, 763–765; 714/733–738, 714/740
See application file for complete search history.

(56) References Cited

U.S. PATENT DOCUMENTS

| | | | | |
|---|---|---|---|---|
| 5,583,502 A | * | 12/1996 | Takeuchi et al. | 341/120 |
| 5,617,037 A | * | 4/1997 | Matsumoto | 324/763 |
| 5,818,370 A | * | 10/1998 | Sooch et al. | 341/120 |
| 2003/0179118 A1 | * | 9/2003 | Mizutani et al. | 341/118 |

* cited by examiner

*Primary Examiner*—Howard L. Williams
(74) *Attorney, Agent, or Firm*—Tucker Ellis & West LLP

(57) ABSTRACT

A generalized method for testing DACs (Digital to Analog Converters) and ADCs (Analog to Digital Converters), such as Sigma Delta (Successive Approximation), Pipeline or Flash ADCs. The DACs and ADCs are tested in pairs using a Digital Tester and on chip test circuitry. The DACs and ADCs may be tested at the highest clock frequency allowed in the specification, shortening test time. The test circuits required for this test scheme comprise cell logic two multiplexer cells and an internal Analog Test Bus. This scheme is extendable to the testing of many DACs and ADCs on the same IC. The number of DACs and ADCs need not be equal. Furthermore, the DACs may have more (or less) bits (addresses) than the ADCs. An ADC may be tested with more than one DAC or vice versa to determine which cell is at fault if a test fails.

20 Claims, 25 Drawing Sheets

DIGITAL BIST TEST SCHEME FOR ADC/DAC CIRCUITS

BACKGROUND OF THE INVENTION

The present invention relates generally to test circuits and more specifically to a system and method for performing a digital built in self test (BIST) of Analog to Digital (ADC) and Digital to Analog (DAC) circuits.

The function of test of a semiconductor device is twofold. First, is design debug, to understand the failing section of the device, identify areas for changes and verify correct modes of operation. The second major area is to simply separate good devices from bad devices in a production test environment.

The basis for all testing of complex integrated circuits is a comparison of known good patterns to the response of a DUT (device under test). The simulation of the devices is done with input stimuli and those same input stimuli (vectors) are presented on the DUT. Comparisons are made cycle by cycle with an option to ignore certain pins, times or patterns. If the device response and the expected response are not in agreement, the device is usually considered defective.

Self-testing (built-in self-test or BIST) is essentially the implementation of logic built into the circuitry to perform testing without the use of an external tester for pattern generation and comparison purposes. "Logic", as used herein, includes but is not limited to hardware, firmware, software and/or combinations of each to perform a function(s) or an action(s), and/or to cause a function or action from another component. For example, based on a desired application or need, logic may include a software controlled microprocessor, discrete logic such as an application specific integrated circuit (ASIC), a programmable/ programmed logic device, memory device containing instructions, or the like, or combinational logic embodied in hardware. Logic may also be fully embodied as software. A tester is still needed to categorize failures and to separate good from bad units. In this case, the test system supplies clocks to the device and determines pass/fail from the outputs of the device. The sequential elements are run with a known data pattern and a signature is generated. The signature can be a simple go or no-go signal on one pin of the part, or the signal may be a polynomial generated during testing, wherein the polynomial has some significance as to the actual state of the DUT during testing.

In a typical semiconductor manufacturing environment, there are usually a plethora of digital testers available, but few analog testers. This is because analog testers are usually limited in number, limited in capability and can be more expensive than digital testers.

The typical semiconductor chip is comprised of analog and digital components. This can require double testing. Furthermore, the analog test function can be slow. Thus, there is a need for improved testing techniques.

BRIEF SUMMARY OF THE INVENTION

In accordance with an aspect of the present invention, there is described herein a system and method that provides the ability to accurately test an analog portion of a chip using a digital tester. An aspect of the present invention is that a chip can be tested once to verify the integrity of the digital and analog components.

In accordance with an aspect of the present invention, there is described herein a generalized method of testing voltage output DACs (Digital to Analog Converters) and ADCs (Analog to Digital Converters), such as Sigma Delta (Successive Approximation), Pipeline or Flash ADCs. The DACs and ADCs are tested in pairs using a Digital Tester and on chip test circuitry. The DACs and ADCs may be tested at the highest clock frequency allowed in the specification, shortening test time. The test circuits required for this test scheme comprise cell logic, two analog multiplexer cells and an internal Analog Test Bus. This scheme is extendable to the testing of many DACs and ADCs on the same IC. The number of DACs and ADCs need not be equal. Furthermore, the DACs may have more (or less) bits (addresses) than the ADCs. An ADC may be tested with more than one DAC or vice versa to determine which cell is at fault if a test fails.

In accordance with an aspect of the present invention, there is disclosed herein an apparatus comprising a digital to analog converter having an input and an output, the digital to analog converter responsive to produce an analog output signal at the output based on a digital signal received at the input. The apparatus further comprises a test bus, a digital to analog converter pad and a first controllable switching device operable to switch the analog output signal to one of the group consisting of the test bus and the digital to analog converter pad. The apparatus also comprises an analog to digital converter having an input and an output, an analog to digital converter pad, and a second controllable switching device operable to couple one of the test bus and the analog to digital converter pad to the input of the analog to digital converter.

In accordance with an aspect of the present invention, there is disclosed herein an apparatus comprising a plurality of digital to analog converters, a plurality of analog to digital converts, a test bus, and means for coupling not more than one of the plurality of digital to analog converters to not more than one of the plurality of analog to digital converters via the test bus. The apparatus further comprises means for applying a test signal to the not more than one of the plurality of digital to analog converters and means for comparing an output from the not more than one of the analog to digital converters with the test signal.

In accordance with an aspect of the present invention, there is disclosed herein a method for performing a built-in self-test. The method comprising coupling not more than one of a plurality of digital to analog converters to not more than one of a plurality of analog to digital converters via a test bus, applying a test signal to the not more than one of the plurality of digital to analog converters, and comparing an output from the not more than one of the analog to digital converters with the test signal.

Still other objects of the present invention will become readily apparent to those skilled in this art from the following description wherein there is shown and described a preferred embodiment of this invention, simply by way of illustration of at least one of the best modes to carry out the invention. As it will be realized, the invention is capable of other different embodiments and its several details are capable of modifications in various obvious aspects all without departing from the invention. Accordingly, the drawing and descriptions will be regarded as illustrative in nature and not as restrictive.

BRIEF DESCRIPTION OF THE SEVERAL VIEWS OF THE DRAWING

The accompanying drawings incorporated in and forming a part of the specification, illustrates several aspects of the present invention, and together with the description serve to explain the principles of the invention.

DETAILED DESCRIPTION OF INVENTION

Figure 1:
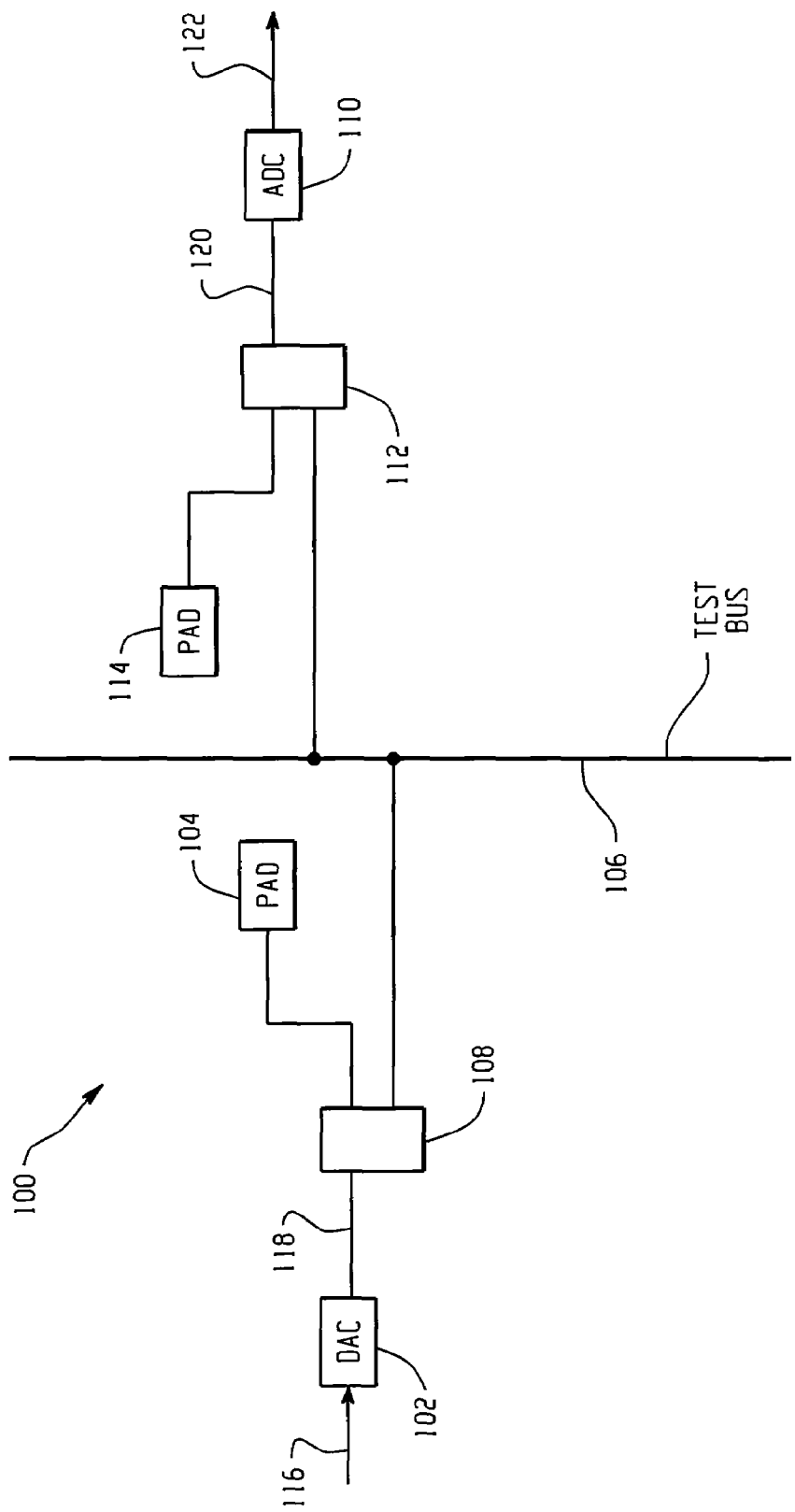
FIG. 1 is a block diagram of a system in accordance with an aspect of the present invention.

Throughout this description, the preferred embodiment and examples shown should be considered as exemplars, rather than limitations, of the present invention. Like reference numbers refer to like components. Described herein is a generalized method of testing voltage output DACs and Sigma Delta (Successive Approximation), Pipeline or Flash ADCs. The DACs and ADCs are tested in pairs using only a Digital Tester and on chip test circuitry. The DACs and ADCs may be tested at the highest clock frequency allowed in the specification, shortening test time. The test circuits required for this test scheme consist of standard cell logic with the exception of two additional 'analog' IO mux cells and an internal Tristate Analog Test Bus. This scheme is extendable to the testing of many DACs and ADCs on the same IC. The number of DACs and ADCs need not be equal. The DACs may have more bits (addresses) than the ADCs. An ADC may be tested with more than one DAC or vice versa to determine which cell is at fault if a test fails.

The test scheme redirects (feeds back) the analog voltage from a DAC through the Tristate Analog Test Bus to the input of an ADC. The redirection of the analog signal (feedback) is accomplished via the two analog muxes. In normal (non-test) mode the muxes send the analog signals from the DAC to the DAC Pad and from the ADC Pad to the ADC. In the Standard test mode the DAC Test Logic generates digital test patterns. These patterns are sent to the DAC and through digital muxes to the ADC Test logic. The DAC analog voltage is sent to the input of the ADC via the analog feedback path. The digital output of the ADC is compared to the original DAC digital input for a match (See FIG. 3).

Two types of tests may be performed with the test logic. One type of test, the Standard Specification Test (described above) will determine if the DAC and ADC operate within their voltage specification and possibly (if both the DAC and the ADC can be run at their top operating frequencies) within their slew rate specification. The Standard test can be used to characterize the speed and accuracy of the DAC/ADC pair by varying the:

1. The speed of the test by changing the test clock (TCLK) frequency.

(The test clock TCLK should be held low except during test mode operation)

2. The number of addresses compared by changing the shift bits in the ADC Test Logic.

3. The range of addresses tested by setting the start and end addresses in the DAC Test Logic.

4. The direction of the error with the TESTOUT plus and minus outputs in the ADC Test Logic.

Once a number of DAC/ADC pairs have been characterized, the settings for the variables in 1 through 4 can be set for production testing.

The second type of testing is the Parametric Test where set voltage levels can be sensed from the DAC or provided to the ADC by the digital tester to further characterize either the ADC or the DAC or confirm the results from the Standard tests.

The type of ADC chosen in this example is the Successive Approximation ADC since it has the most complicated timing and is commonly used (a description of the circuit modifications needed to test Pipeline and Flash ADCs is provided herein infra). For purposes of ease of explanation, the maximum number of ADC or DAC bits chosen for this example is 17, the number of digital test muxes chosen is eight so that eight DACs and eight ADCs may be tested on the IC. The number of test bits and digital muxes have been chosen as examples to show that many DACs and ADCs of high bit count may be tested, but the number of comparison bits and digital muxes (multiplexers) used in the test logic may be decreased or increased as desired An aspect of the present invention is that DAC Test Logic can be designed such that not only will all addresses be checked for accuracy but the slew rate will also be checked. The address of the DAC will change and one TCLK cycle later (The minimum slew time) the ADC will start to sample the resulting analog voltage.

In a preferred embodiment (see e.g. FIG. 3), each digital test block has a POWER_ON input used to RESET the test logic so that the digital test circuits are in the normal operating mode (not BIST Standard or Parametric Test mode) at startup. If the circuits are to stay in normal mode it is best to keep the POWER_ON high until one of the BIST tests is initiated.

Referring to FIG. 1, there is an apparatus 100 comprising a digital to analog converter (DAC). DAC 102 has an input 116 and an output 118. DAC 102 receives a digital signal at input 116 and produces an analog signal on output 118 responsive to the digital signal received at input 116. The analog signal on output 118 is routed by multiplexer 108. In normal mode, the analog signal from output 118 is routed by multiplexer 108 to PAD 104. In test mode, multiplexer 108 routes the analog signal from output 118 to test bus 106.

An analog to digital converter (ADC) has an input 120 for receiving an analog signal and produces a digital output on output 122 corresponding to the voltage level of the analog signal. Input 120 of ADC 110 is coupled to multiplexer 112. In normal mode, multiplexer 112 couples PAD 114 to input 120 of ADC 110. In a test mode, multiplexer 112 couples input 120 of ADC 110 to test bus 106.

Because the signals between output 118 of DAC 102 and input 120 of ADC 110 are analog, analog multiplexers are employed for multiplexers 108, 112 and an analog bus is employed for test bus 106. An aspect of the present invention is that provided DAC 102 and ADC 110 are functioning properly, the digital signal at the output 112 of ADC 110 should be equal to, or within a desired range, of the signal received at input 116 of DAC 102. For example, depending on the desired accuracy of ADC 110, DAC 102 and ADC 110 can be deemed to be functioning properly if the signal at output 122 of ADC 110 is within one least significant bit (LSB) of the signal received at input 116 of DAC 102. For example, if the signal at 112 is one bit more (+1), equal to, or one bit less (−1) than the signal at input 116, DAC 102 and ADC 110 can be considered to be functioning properly.

In accordance with another aspect of the present invention, apparatus 100 can test DAC 102 and ADC 110 even if DAC 102 and ADC 110 have differing address ranges. For example, DAC 102 can have a 10 bit address range whereas ADC 110 can have an 8 bit address range. If the first 8 bits of ADC 110 are within a desired range of the 8 most significant bits (MSBs) of DAC 102, DAC 102 and ADC 110 can be considered to be functioning properly. In addition, the two least significant bits (LSBs) can also be tested. The signal at input 116 can start with the first 8 bits at a desired value, and the remaining two bits (the LSBs) set to 0. The input at 116 can be cycled through each value for the LSBs (e.g. 00, 01, 10 and 11 in this example) and the output 122 of ADC 110 can be observed. If the output increments not more than once throughout the cycle (i.e., the value of the MSBs change by 1) then the LSBs of ADC 110 can also be considered to be functioning properly. This is because ADC 110 will typically round up/down analog voltages received at input 120. When the LSBs are all 0's, the value of the MSBs will typically be rounded down to a minimum value and when the LSBs are all 1's the MSBs will typically be rounded up to a maximum value. However, it is unknown at which intermediate value (e.g. 01, 10 or 11) the MSBs will change from the rounded down (minimum) value to the rounded up (maximum) value. There should only be one change per cycle. Thus, an aspect of the present invention is that a lower resolution ADC can be used to test the LSBs of a higher resolution DAC.

Figure 2:
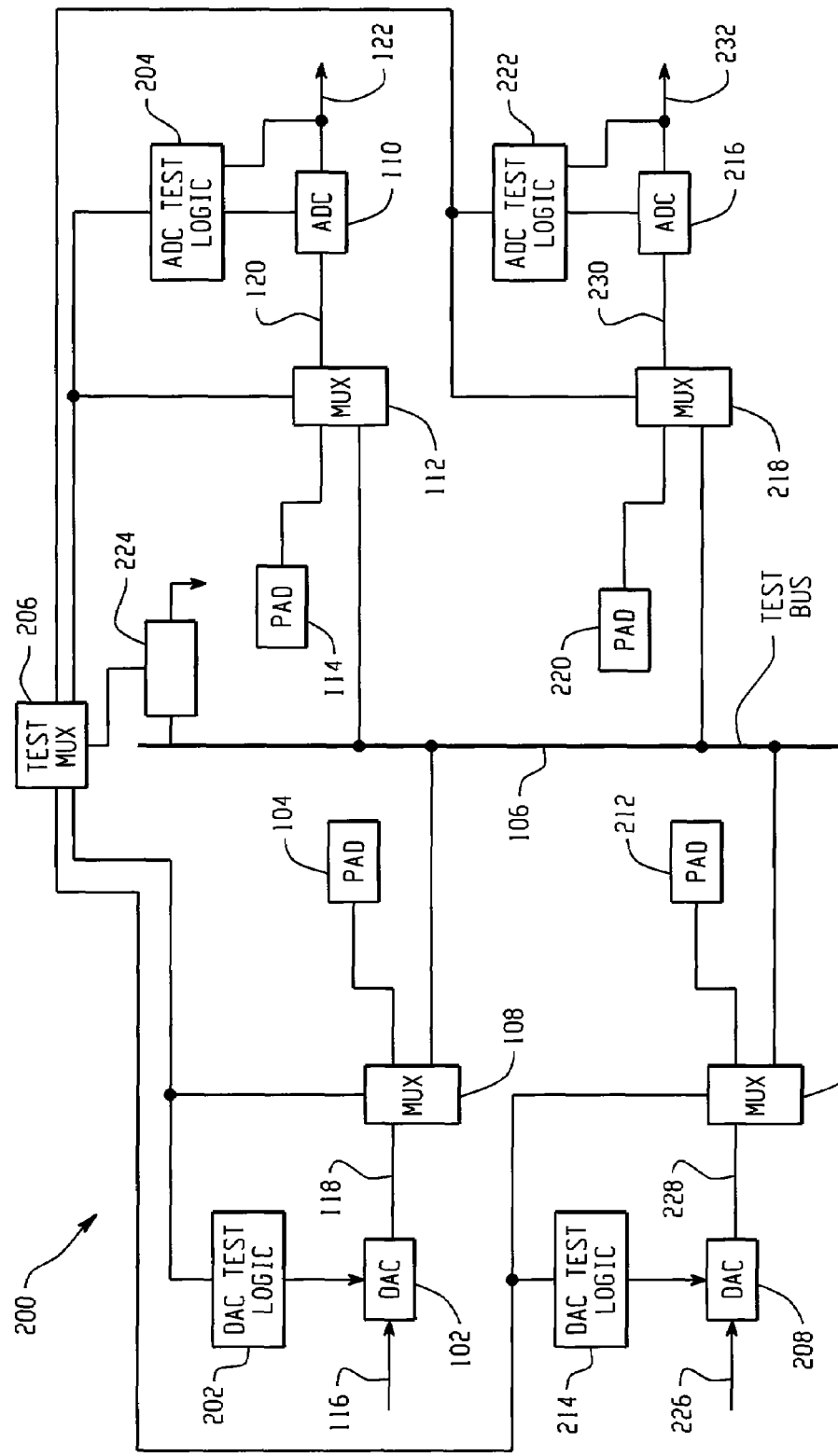
FIG. 2 is a block diagram of a system employing multiple digital to analog converters and multiple analog to digital converts in accordance with an aspect of the present invention.
Figure 3A:
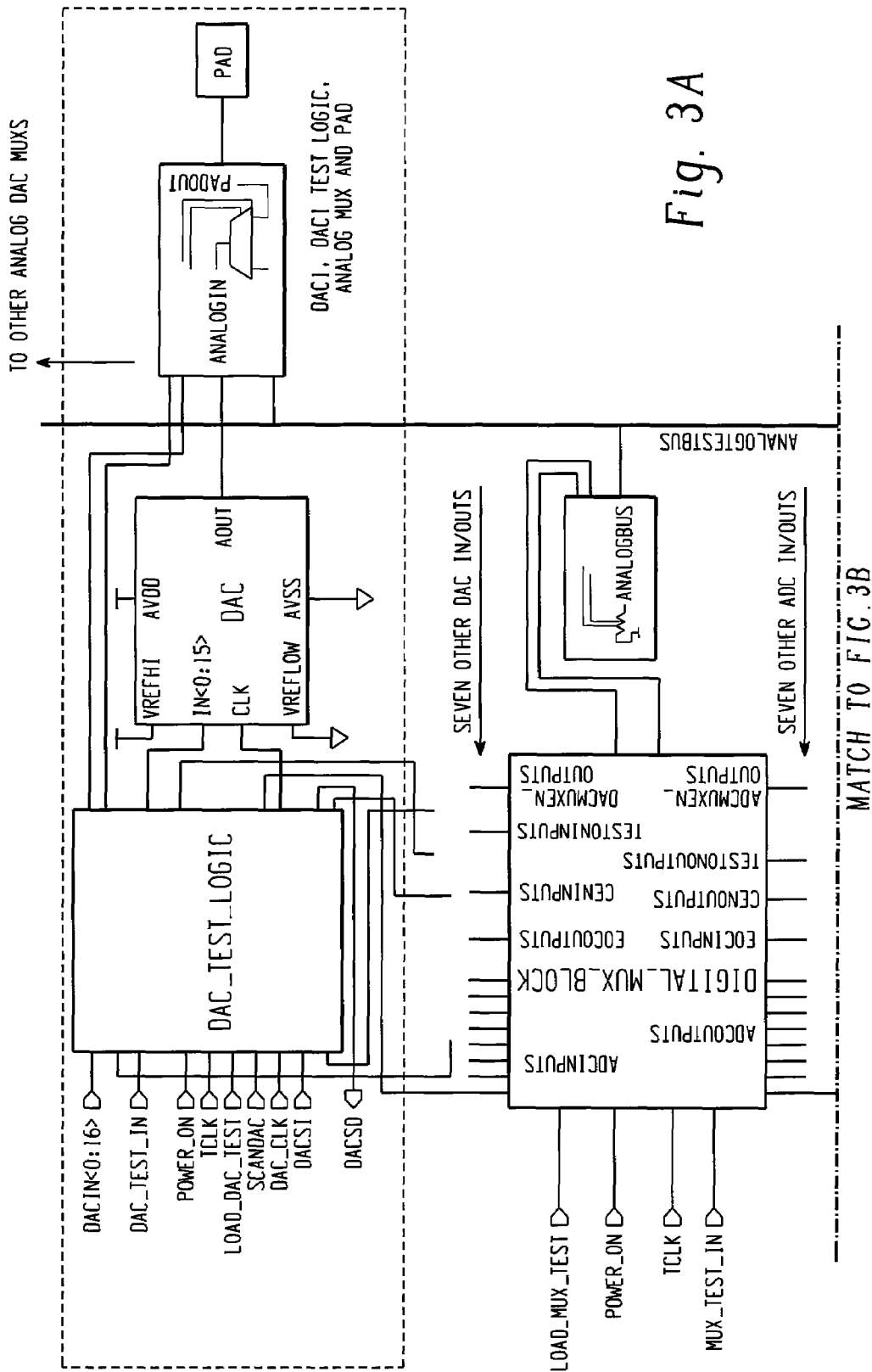
FIG. 3 is a detailed block diagram of a system in accordance with an aspect of the present invention.
Figure 3B:
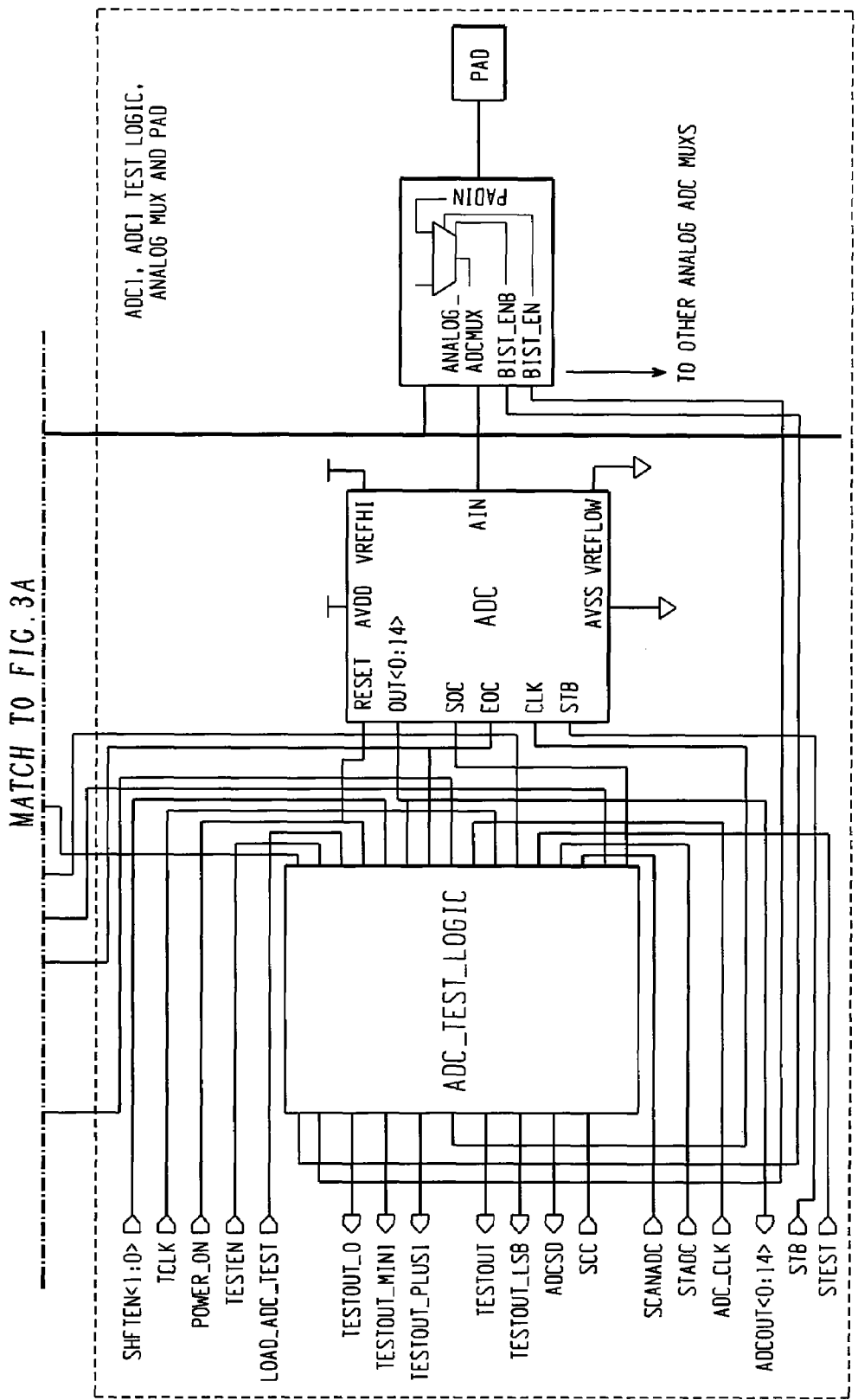

Because multiplexers 108, 112 are employed to couple DAC 102 and ADC 110 to test bus 106, an aspect of the present invention is that test bus 106 can be shared by more than one DAC or ADC (see e.g. FIGS. 2 and 3). Furthermore, the number of DACs and ADCs coupled to test bus 106 do not have to be equal. For example a plurality of DACs (not shown) can be coupled to test bus 106, and each DAC can be tested using ADC 110. Similarly, a plurality of ADCs (not shown) can be coupled to test bus 106 and each ADC can be tested using DAC 102.

FIG. 2 is a block diagram of a system 200 employing multiple digital to analog converters 102, 208 and multiple analog to digital converters 110, 216 in accordance with an aspect of the present invention. A digital signal received by DAC 102 at input 116 is converted to an analog signal and output on output 118 to multiplexer 108. In a normal mode, multiplexer 108 routes the analog signal to PAD 104. In a test mode, multiplexer 108 routes the analog signal to test bus 106. Similarly, a digital signal received at input 226 by DAC 208 is converted to an analog signal. The analog signal is output at output 228 to multiplexer 210. In a normal mode, multiplexer 210 routes the analog signal to PAD 212. In a test mode, multiplexer 210 routes the analog signal to test bus 106.

An analog signal is received at input 120 by ADC 110 via multiplexer 112. The analog signal is converted to a digital signal at output 122. In a normal mode, multiplexer 112 routes a signal from PAD 114 to the input of ADC 110. In a test mode, multiplexer 112 routes a signal from test bus 106 to ADC 110. An analog signal is received at input 230 by ADC 216 via multiplexer 218. ADC 216 converts the analog signal to a digital signal output at 232. In a normal mode, multiplexer 218 routes a signal from PAD 220 to the input of ADC 216. In a test mode, multiplexer 218 routes a signal from test bus 106 to ADC 216.

Each DAC is coupled to associated DAC test logic. DACs 102, 208 are associated with DAC test logic 202, 214 respectively. DAC test logic 202, 214 provides a digital test signal to its associated DAC 202, 214. Additional functionality of DAC test logic 202, 214 will be described herein infra.

Each ADC is coupled to associated ADC test logic. ADCs 110, 216 are associated with ADC test logic 204, 222 respectively. As will be described herein, ADC test logic 204, 222 compares the output of its associated ADC (e.g. ADC 110, 216 respectively) with an expected result.

Test multiplexer 206 selects which of DACs 102 and 208 to test along with a corresponding ADC 118, 216 for the test. In accordance with an aspect of the present invention, any one of DACs 102, 208 can be tested with any one of ADCs 110, 216. This allows ADC/DACs to be tested based on any desired criteria. For example, if DAC 102 is an 8 bit DAC, DAC 208 is a 10 bit DAC while ADC 110 is a 10 bit ADC and ADC 216 is an 8 bit ADC, test multiplexer 206 can select combinations of DAC 102/ADC 216 and DAC 208/ADC 110 so that the DAC and ADC selected for testing have matching resolutions.

Test multiplexer 206 controls the switching of multiplexers 108, 112, 210, 218 to couple a selected DAC/ADC combination for a test. For example, if DAC 102 is to be tested with ADC 110, test multiplexer 206 signals multiplexer 108 to route output 118 of DAC 102 to test bus 106 and also signals multiplexer 112 to route the signal from test bus 106 to input 102 of ADC 110. As another example, if DAC 102 is to be tested with ADC 216, test multiplexer 206 signals multiplexer 108 to route output 118 of DAC 102 to test bus 106 and also signals multiplexer 218 to route the signal from test bus 106 to input 230 of ADC 216. Test multiplexer only allows one DAC and one ADC to be coupled to test bus 106 at any given time. When no tests are being performed, test multiplexer 206 signals controllable switching device 224 to couple test bus 106 to a ground.

In a preferred embodiment, analog multiplexers 108, 210 are made up of large pass transistors to reduce the on resistance as much as possible (the transistors through the on chip analog bus path may be smaller since the capacitances are smaller than going off chip). The layout of these large transistors will result in capacitive paths from the pad (e.g. PAD 104 or 212) and the DAC output (e.g. DAC output 118 or 228 respectively) to analog bus 106 and from analog bus 106 through to the ADC input (e.g. 120 or 230). The result is that a large change at the output of the DAC (or several DACs, if more than one DAC is connected to the analog bus 106) would result in a small voltage change at the input to the ADC (ADCs) causing inaccuracy during normal operation. Using a large transistor to ground (i.e. for controllable switching device 224) provides a low resistance path to ground so there is negligible signal transfer from the output of the DACs 118, 228 to the input of the ADCs 120, 230 through analog bus 106.

Test multiplexer 206 is coupled to DAC test logic 202, DAC test logic 214, ADC test logic 204 and ADC test logic 222 and, as will be described in more detail herein, is operable to route signals between the DAC test logic and the ADC test logic of the selected DAC/ADC pair. This enables the ADC test logic associated with the selected ADC to determine the test value input into the DAC being tested so that the ADC test logic can determine whether the DAC/ADC pair being tested passed the test.

For example, if DAC 208 and ADC 110 are selected for the test, test multiplexer ensures that controllable switching device 224 is not grounding test bus 106. Test multiplexer 206 signals multiplexer 210 to couple output 228 of DAC 208 to test bus 106. Test multiplexer 206 also signals multiplexer 112 to couple input 120 of ADC 110 to test bus 106. In addition, test multiplexer 206 routes signals between the DAC and ADC being tested enabling the results to be enabled. For example, DAC test logic 214 selects a test value. The test data is forwarded to test multiplexer 206, which forwards the data to ADC test logic 204. ADC test logic verifies the output 122 from ADC 110 using the test data.

An aspect of the present invention is that ADC test logic (e.g. 204 or 222) can be configured to consider a test result valid (i.e. the ADC associated with the test logic, e.g. ADC 110 or 216) even if the output of the ADC does not match the data. For example, if an 8 bit ADC is used and only 7 bits of resolution is desired, then a test result is considered valid if the 7 MSBs match. In another embodiment, a test result can be considered valid if the LSB does not match (e.g. the LSB is +1 or −1 different from the test value). In yet another embodiment, least significant bits can be tested by cycling through all of the values. For example, if DAC 102 is a 10 bit DAC and is being tested with ADC 110 and ADC 110 is an 8 bit ADC, then the associated test logic 204 verifies the 8 most significant bits match. For the first test, DAC test logic 202 tests DAC 102 with the 8 most significant bits and sets the 2 least significant bits to 00. ADC test logic 204 verifies this result. DAC test logic then tests DAC 102 with the remaining combinations of least significant bits, i.e. 01, 10 and 11. ADC test logic 204 verifies that the least significant bits are working by observing whether the value at output 122 changes not more than one time during the cycle.

After testing is completed, test multiplexer 206 switches multiplexers 108, 112, 210, 218 so that their corresponding component (DAC 102, ADC 110, DAC 208, ADC 216) are coupled to their respective PADs 104, 114, 212, 220. Test multiplexer also sets controllable switching device 224 so that test bus 106 is grounded.

FIG. 3 is a detailed block diagram of a system 300 in accordance with an aspect of the present invention. FIG. 3 shows the BIST test circuits as well as the ADC 110 and DAC 102 under test and associated signal PADs 104, 114.

The additional test circuits are the ADC Test Logic 204, DAC Test Logic 202, Digital Mux Block (Test Multiplexer) 206 and the ANALOGTESTBUS Grounding Circuit 302 comprising controllable switching device 224. Only one ADC 110 and its associated ADC Test Logic 204 and one DAC 102 and its associated DAC Test Logic 202 are shown but more ADCs and DACs may be connected by other Analog Muxes to the test bus (ANALOGTESTBUS) 106 and associated Test Logic circuits may be digitally connected through the Digital Mux Block 206.

The normal inputs to DAC 102 (address and clock) come through the test logic to DAC 102 so that they may be muxed in the DAC Test Logic 202. The analog output 118 of DAC 102 goes through the multiplexer (ANALOG_DACMUX) 108 to PAD 104 in normal operation and the test bus (ANALOGTESTBUS) 106 in Standard test mode.

The ADC 110 analog input comes from PAD 114 through Analog Mux (ANALOG_ADCMUX) 112 to ADC 110 in normal mode. In Standard test mode ADC 110 receives its input signal from the ANALOGTESTBUS 106 via the ANALOG_ADCMUX 112. If a Standard Test is not taking place the Analog Bus Ground Circuit 302 will short the ANALOGTESTBUS 106 to analog ground.

Digital Mux Block 206 steers the DAC addresses and the TESTON and CEN signals to ADC Test Logic 204 and the EOC (End Of Conversion) signal to DAC Test Logic 204 as well. The clock input to ADC 110 and the SOC (Start Of Conversion) signal come through ADC Test Logic 204 to allow for muxing in ADC Test Logic 204 as do the normal ADC addresses and the ADC clock.

In this example the high reference voltages for DAC 102 and ADC 110 are tied to analog VDD and the low reference voltages are tied to analog ground.

Figure 4:
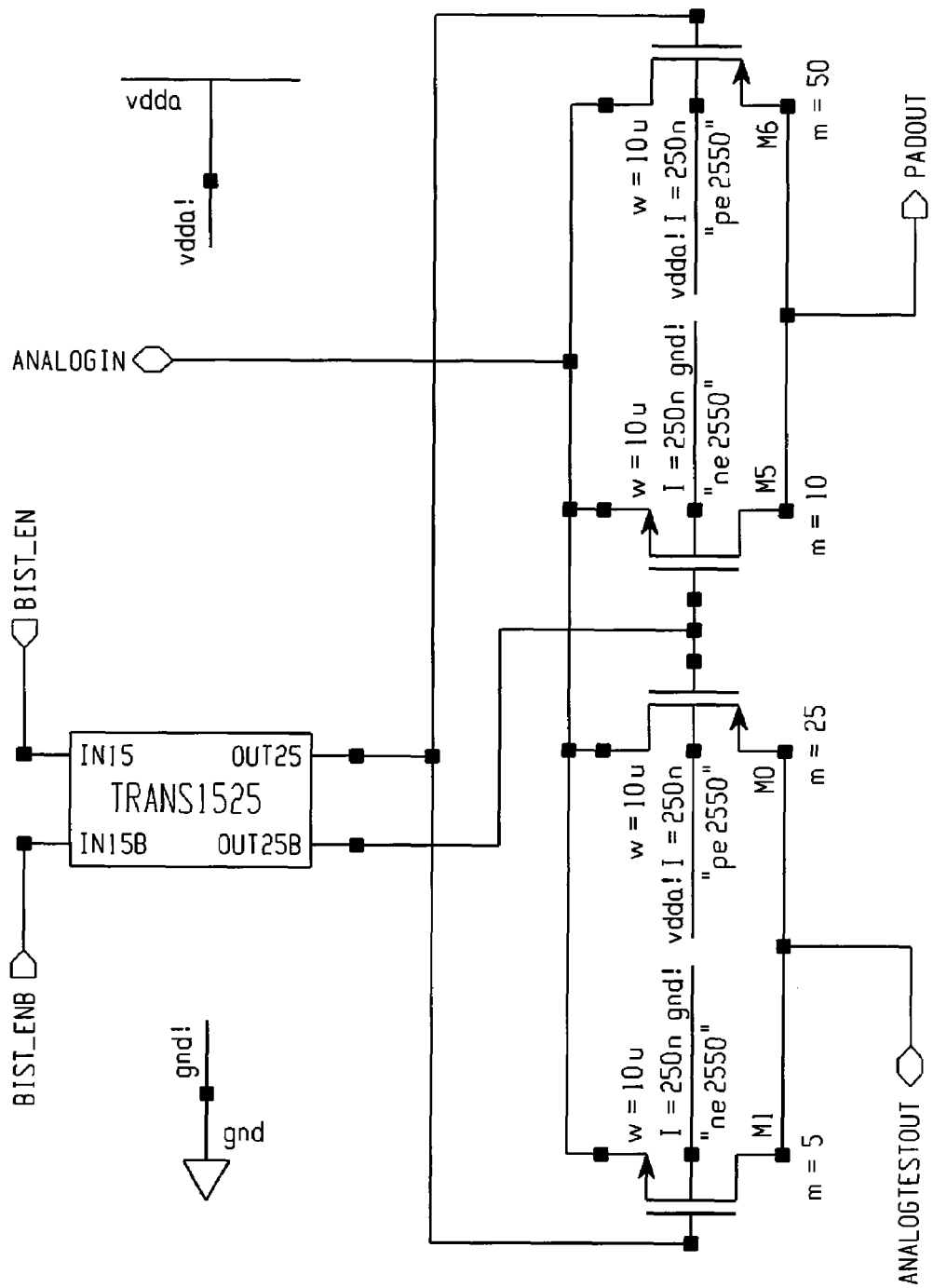
FIG. 4 is a combination block/circuit diagram of a multiplexer circuit suitably adapted for use as an analog multiplexer for a DAC.

FIG. 4 is a block diagram of a multiplexer circuit (ANALOG_DACMUX) 400 suitably adapted for use as a multiplexer for a DAC, such as multiplexer 108 or 210. The ANALOG_DACMUX 400 is used to steer the analog voltage from the DAC to the Pad via PADOUT (if the BIST_EN/BIST_ENB pin is low/high) or to the ANALOGTESTBUS via ANALOGTESTOUT (if the BIST_EN/BST_ENB pin is high/low).

Figure 5:
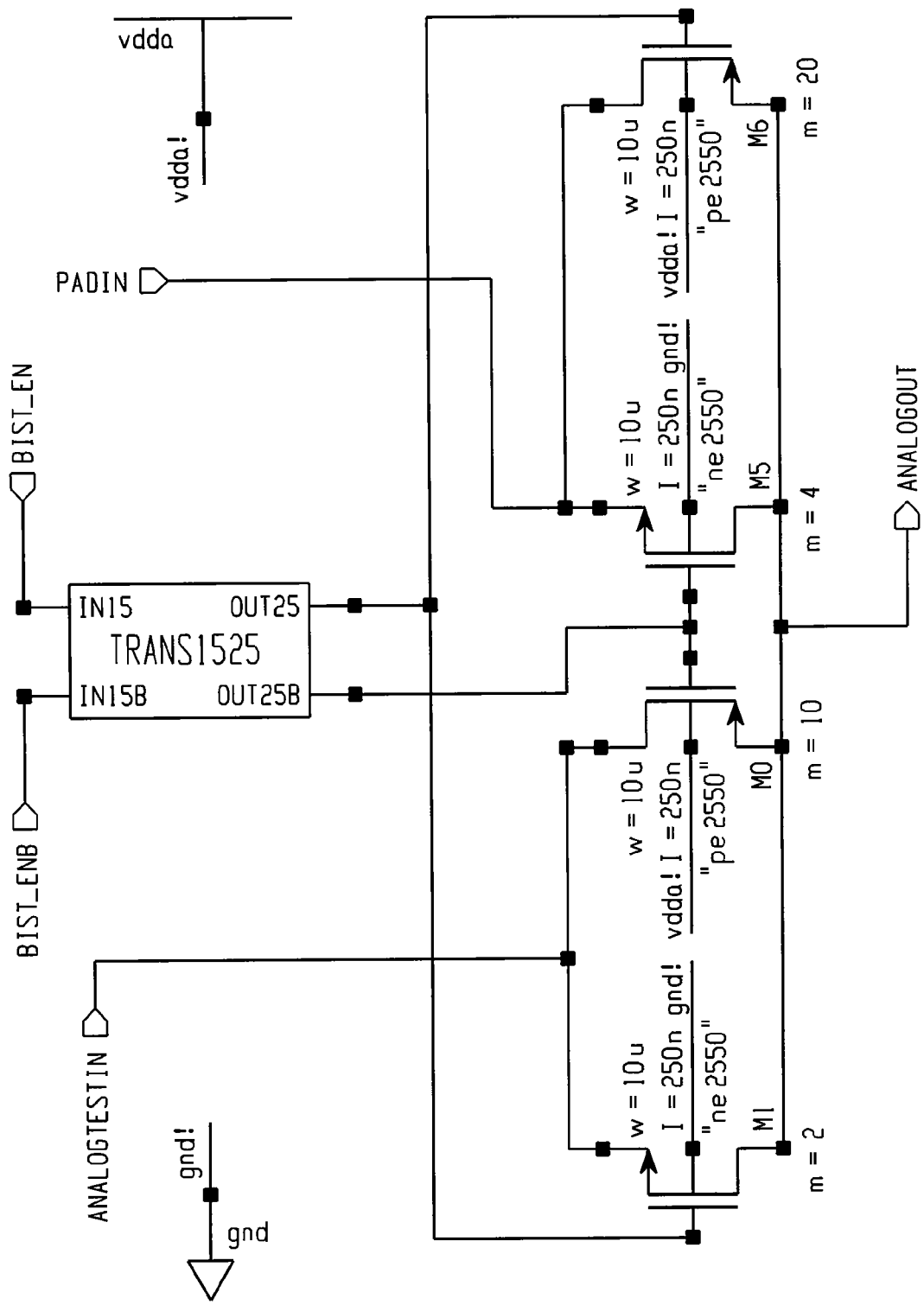
FIG. 5 is a combination block/circuit diagram of a multiplexer circuit suitably adapted for use as an analog multiplexer for an ADC.

ANALOG_DACMUX 400 pins are configured as follows. BIST_EN—input—switches the DAC output analog voltage from the Pad to the Analog Test Bus. Active high. BIST_ENB—input—Switches the DAC output analog voltage from the Pad to the Analog Test Bus. Active low. ANALOGIN—'input'—This input receives the DAC output analog voltage. PADOUT—'output'—the mux analog output to the IC Pad. ANALOGTESTOUT—'output'—the mux analog output to the Analog Test Bus FIG. 5 is a block diagram of a multiplexer circuit (ANALOG_ADCMUX) 500 suitably adapted for use as an analog multiplexer for an ADC, such as multiplexer 112 or 218. The ANALOG_ADCMUX 500 is used to select the analog voltage from the pad (if the BIST_EN/BIST_ENB pin is low/high) or the ANALOGTESTBUS (if the BIST_EN/BIST_ENB pin is high/low). It is contemplated in a preferred embodiment that there is one ANALOG_DACMUX for each DAC and one ANALOG_ADCMUX for each ADC.

Figure 6:
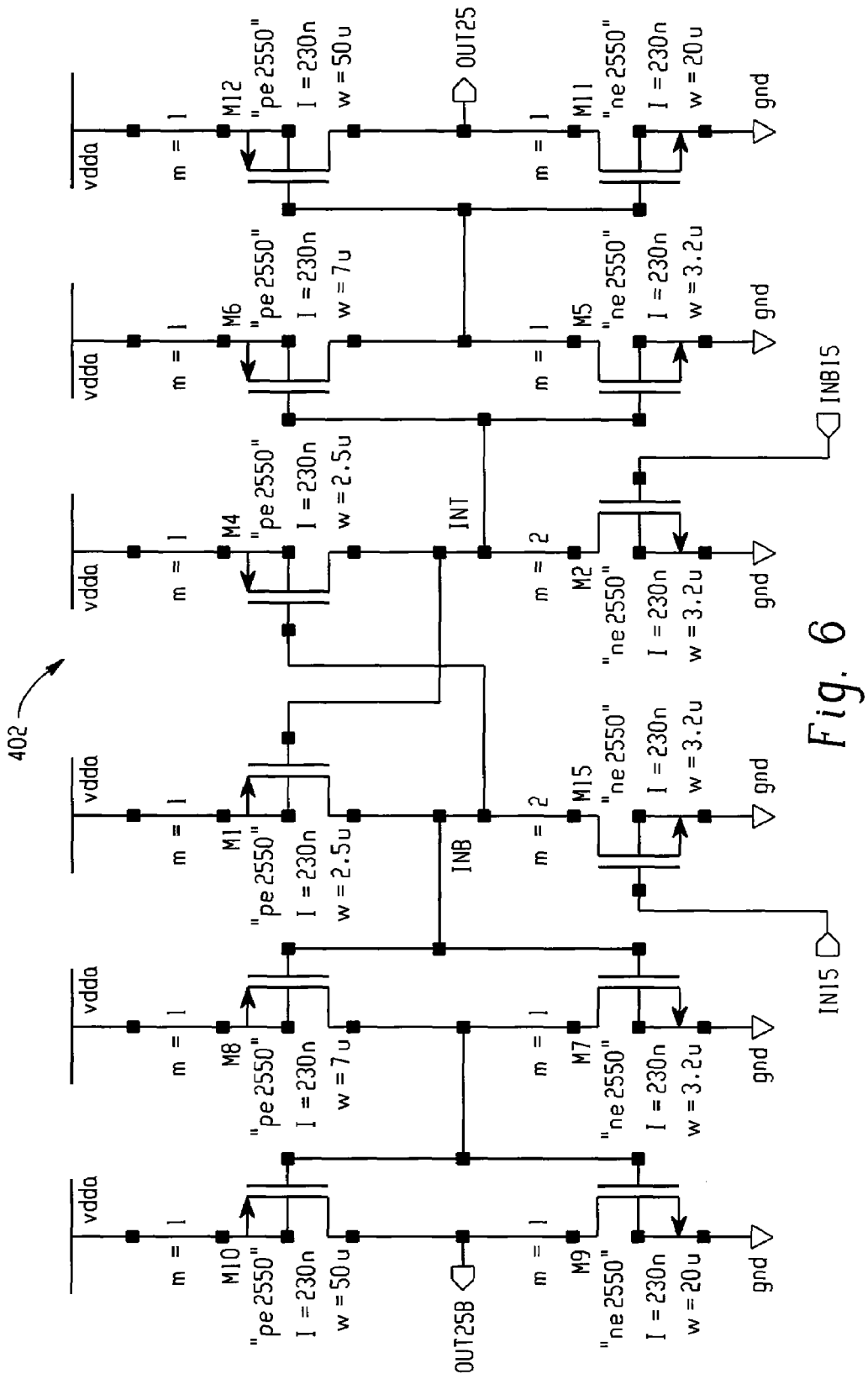
FIG. 6 is a circuit diagram of a buffer/translator employed by the multiplexers illustrated in FIGS. 4 and 5.

The pins of ANALOG_ADCMUX 500 are configured as follows. BIST_EN—input—Switches the analog voltage input to the ADC from the Pad to the Analog Test Bus. Active high. BIST_ENB—input—Switches the analog voltage input to the ADC from the Pad to the Analog Tristate Bus. Active low. ANALOGOUT—'output'—This output sends output analog voltage to the ADC. PADIN—'input'— the normal analog input from the Pad. ANALOGTESTIN—'input'—the mux analog input from the Analog Test Bus Both muxes 400, 500 use the same basic circuit but the input and output names change and the transistor sizes of the ADC mux 500 are smaller. The two circuits consist of a voltage translator/buffer 402 to raise the digital BIST_EN and BIST_ENB signal levels from 1.5 volts to 2.5 volts (See FIG. 6) (and drive the pass transistors) and two pair of large p and n transmission transistors to pass the analog voltages.

Figure 7:
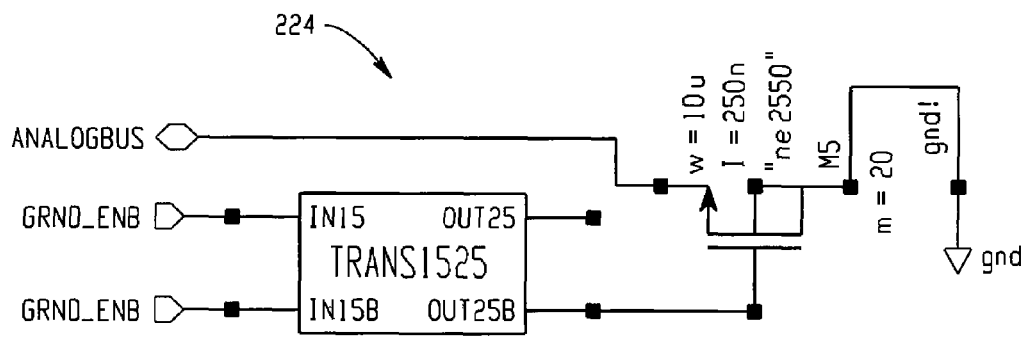
FIG. 7 is an exemplary circuit diagram for a controllable switching device to couple a test bus to ground in accordance with an aspect of the present invention.

FIG. 7 is an exemplary circuit diagram (ANALOG_BUS-GRND circuit) for controllable switching device 224 (FIG. 2) to couple a test bus to ground in accordance with an aspect of the present invention. The ANALOG_BUSGRND Circuit is used to short the ANALOGTESTBUS to ground when a Standard BIST Test is not taking place. Only one ANALOG_BUSGRND Circuit is required on the test bus.

The pins of ANALOG_BUSGRND circuit 224 are configured as follows. Inputs GRND_EN and GRND_ENB control when the analog bus is coupled to ground. When GRND_EN is high and GRND_ENB is low, the analog bus is coupled to ground. When GRND_EN is low and GRND_ENB is high, the analog bus is not coupled to ground. GRND_EN and GRND_ENB are complimentary inputs, so GRND_EN and GRND_ENB should not be the same value (e.g. both GRND_EN and GRND_ENB high, or both GRND_EN and GRND_ENB low).

The number of ANALOG MUXes and the length, width and resistance of the ANALOG TEST BUS determine the maximum test frequency. In a preferred embodiment, the resistance of the ANALOGTESTBUS between any DAC and ADC is no more than 100 ohms (Approximately =to the Analog Mux worst case resistance) and the capacitance of the ANALOGTESTBUS be no more than 2 pf (including the load from the Analog Mux ANALOGTESTIN and ANALOGTESTOUT pins) to allow for the maximum voltage range at the highest slew rate (effective test frequency).

| ANALOG MUX BUS MAXIMUM FREQUENCY EXAMPLE | | | |
|---|---|---|---|
| NUMBER of DACs | NUMBER of ADCs | SEPARATION DISTANCE (UM) | ANALOG BUS WIDTH/RESIS (TC260 - 4$^{TH}$ MET.) | MAX. FREQ. (MHZ) |
| 2 | 2 | 2500 UM | 3 UM/100 OHMS | 7 MHZ |

Figure 8:
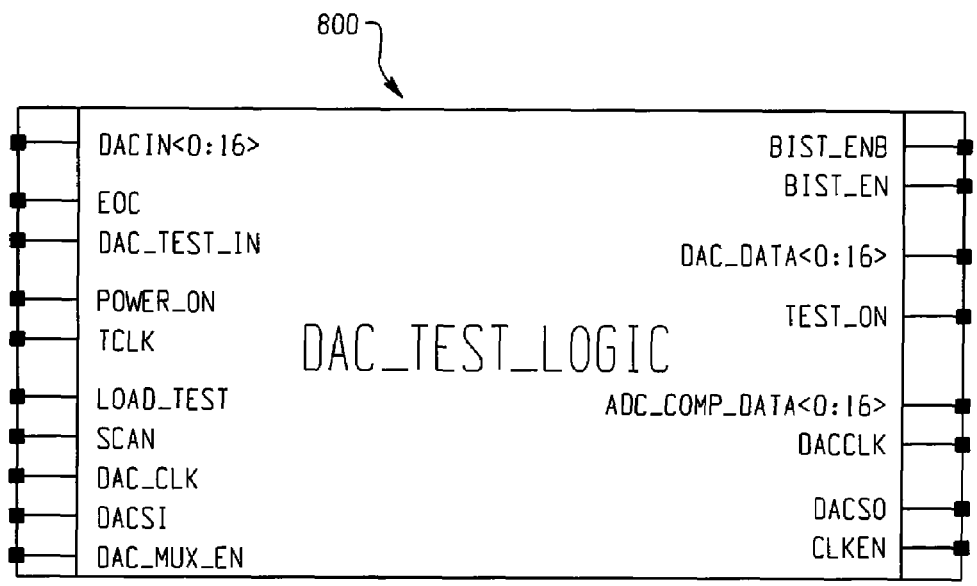
FIG. 8 is an exemplary DAC test logic block.

FIG. 8 is an exemplary DAC test logic block 800. Each DAC (e.g. DAC 102 in FIGS. 1-3, DAC 208 in FIG. 2) has a DAC TEST LOGIC 202, 214 block used to control the test and normal operation of the DAC 102, 208. When the proper signals are asserted the DAC Test Logic 800 produces the BIST (Built In Self Test) address patterns used to test the DAC. DAC Test Logic 800 has two modes of test operation, standard test and parametric test. With the standard test the patterns generated are used to test a DAC/ADC pair. With the parametric test the test patterns are used to generate addresses to be sent to the DAC. The resulting analog voltages may then be measured at the Pad with the digital tester.

The normal DAC input address (DACIN<0:16>) and clock (DAC_CLK) are also input to the test logic so that they may be muxed with the internally generated Test Address and test clock (TCLK). The TCLK input is used to load the 35 bit serial chain and run the BIST test sequences. The signal controlling the two test modes and the highest (HIGH ADDRESS) and lowest (LOW ADDRESS) DAC bit addresses is loaded serially via the DAC_TEST_IN pin.

While the 35 bit serial test chain is being loaded LOAD_DAC_TEST is asserted to load the desired test. One TCLK cycle after LOAD_DAC_TEST goes low the TEST_ON output will go high.

Thus, for example, the serial input to the DAC_TEST_IN would be 000000000000000000000001111111111 for a 10 bit DAC in standard test mode where the full range of addresses is to be tested. A serial input for parametric test mode would be 000000000000000000000001111111110 where the high parametric Pad voltage to be generated by the DAC is the highest possible DAC voltage and the lowest possible DAC voltage. The TCLK input is muxed out of pin DACCLK in test mode (instead of the DAC_CLK used in normal operation) as the DAC input CLK.

In the standard DAC/ADC test, at the TCLK cycle when LOAD_DAC_TEST goes low BIST_EN/BISTENB go high/low, which enables the ANALOG_ADCMUX in test mode and TEST_ON goes high.

TCLK is toggled in the DAC (as DACCLK), the DAC Test Logic, the ADC (as ADCCLK) and the ADC Test Logic. After a number of TCLK cycles the EOC signal from the ADC goes high, then ADC_COMP_DATA<0:16> data will be updated and one TCLK cycle later DAC test logic output address (DAC_DATA<0:16>) will change. The DAC test addresses will alternate between a ramp from the LOW address to the HIGH address and a half level (where the address is the HIGH address/2). Every other address change the address will increase by 1 LSB until the HIGH address level is reached. The addresses will then, again alternating at a half HIGH address level, ramp back to the LOW address level. When this low address is reached the test will stop and TEST_ON will go low indicating that the standard test is complete.

In the Parametric ADC test, after LOAD_DAC_TEST is asserted the BIST_EN/BISTENB stays low/high, which keeps the ANALOG_ADCMUX in normal mode. The address from the DAC Test Logic to the DAC will initially be the LOW address (the initial low value loaded into the serial chain for the parametric test) for a low voltage test. When the TCLK is toggled once, the address will change to the HIGH address (the initial high value loaded into the serial chain for the parametric test). If more voltage levels are desired, toggling the TCLK will cause the address to alternate between the high level and a bitwise ramp from the low level as with the standard test (except the EOC pin has no effect). If a particular DAC address is of interest it may be loaded into the LOW address registers or the HIGH address registers via the serial chain initially.

The ADC_COMP_DATA<0:16> are sent to the ADC Test Logic via the Digital Mux Block along with the CLKEN signal and TEST_ON signal. The ADC_COMP_DATA <0:16> is the registered DAC address for comparison in the ADC test logic. These ADC_COMP_DATA registers may be loaded with the DACSI input if the SCAN input is high. The data from the registers may be read with the DACSO output, again with SCAN high. The DAC_DATA<0:16> outputs are either the normal DAC address (if the test circuit is off) or the test address (if the test circuit is on). The POWER_ON pin is an input used to reset the ADC Test Logic at power up to normal operation mode so that no damage is done to the analog circuits.

The DAC_TEST_LOGIC PINS are configured as follows (see FIGS. 3 and 8). DACIN<0:16>—input—The normal DAC input address. DAC_TEST_IN—input—the serial input to load a DAC test. The test chain has 35 bits. POWER_ON—input—The power on reset input pin. TCLK—input—The test clock input used to load and execute DAC testing. LOAD_DAC_TEST—input—an input pin used to load the test data fed in through the DAC_TEST_IN pin. DAC_CLK—input —The normal operation DAC clock input. DACCLK—output—The DAC Test Logic clock output to the DAC. BIST_EN, BIST_ENB—outputs—the test outputs used to control the ANALOG_DACMUX associated with the DAC under test. DAC_MUX_EN—input—Analog Mux Enable signal from the Digital Mux Block. DAC_DATA<0:16>—output—the address data (either normal or test data) output from the DAC Test Logic to the DAC. TEST_ON—output—an output that indicates if a test is in progress. ADC_COMP_DATA<0:16>—output—The compare register DAC test address output—to the ADC for comparison with the ADC ADDIN address. CLKEN—output—An output from the test logic to enable the LSB circuit in the ADC Test Logic at the proper time. EOC (End Of Conversion)—input—An input from the ADC to enable the DAC change of address for test at the proper time. SCAN—input—A scan input used to scan data into and out of the DAC compare registers. DACSI—input—the input for scanning data into the DAC compare registers. DACSO—output—the output for getting the data out of the DAC compare registers.

Figure 9:
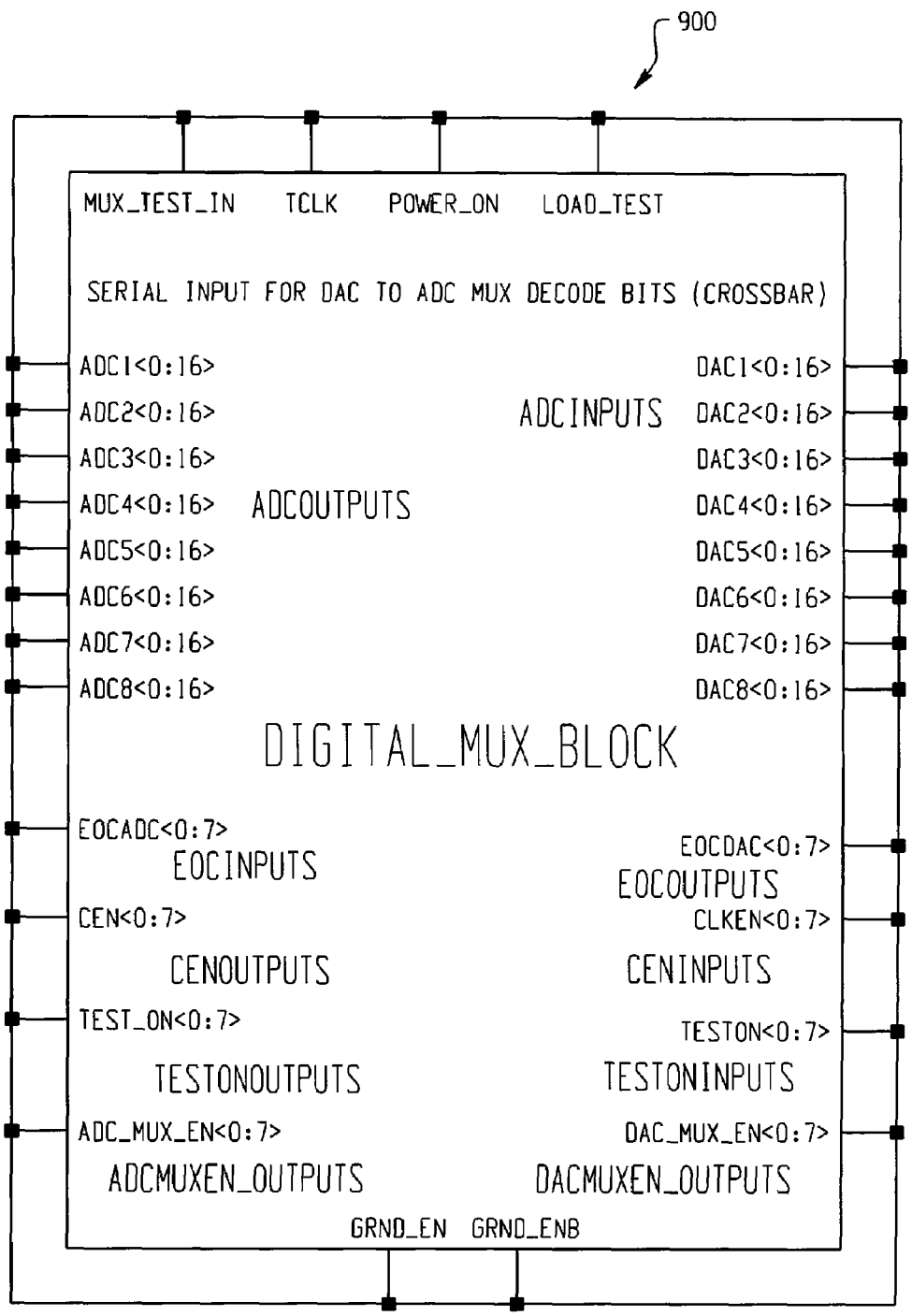
FIG. 9 is an exemplary test multiplexer logic block.

FIG. 9 is an exemplary test multiplexer (DIGITAL_MUX_BLOCK) logic block 900 suitable for test multiplexer 206 (FIG. 2). The Digital Test Muxes are used to send the necessary digital signals between the DAC Test Logic and the ADC Test Logic as well as the ADC and the DAC Test Logic. The Digital Test Muxes also provide the decoded enable signals to the DAC Test Logic and the ADC Test Logic that allow only one ANALOG_ADCMUX BIST_EN and one ANALOG_DACMUX BIST_EN to be enabled. The Digital Test Muxes control which DAC is used to test a particular ADC for the standard DAC/ADC test (if there are more than one DAC or ADC on the IC, otherwise the Digital Mux Circuit would not be needed, the muxed signals could be connected directly). Assuming there are multiple DACs and/or ADCs on the IC, the signals that need to be muxed are the compare address data signals (ADC_COMP_DATA<0:16>), the TEST_ON signal and the CLK_EN signal from the DAC Test Logic and the EOC signal from the ADC. The decode data to control which DAC is muxed to which ADC is fed in serially through MUX_TEST_IN again using TCLK and LOAD_MUX_TEST to load the data into registers. In this case, there are 8 possible ADC destinations and 8 possible DAC sources resulting in a serial chain that is 6 bits long (3 bits of decode data to choose a DAC and 3 bits of decode data to choose an ADC). A power on signal (POWER_ON) is again provided to initially set the internal registers in a default state. The power on initial state will mux the first DAC (DAC1) with the first ADC (ADC1). If a DAC/ADC combination fails, the Digital Mux Block can be reprogrammed to retest with a different combination of ADC/DAC to determine which is failing.

If no TESTON signal is high then the GRND_EN will go high to short the ANALOGTESTBUS to ground (normal operation or Parametric testing).

The DIGITAL_MUX_BLOCK 900 pin configuration are as follows (see FIGS. 3 and 9). MUX_TEST_IN—input—Serial test input for the mux decode control data. (In this example 6 bits). LOAD_MUX_TEST—input—The load signal for the test mux decoders. TCLK—input—The test clock used for clocking the serial decode registers. POWER_ON —input—The reset signal for the serial decode registers. Asserted on power up. DAC1-8<0:16>—input—The DAC address for comparison with the ADC address. ADC1-8<0:16>—output—The muxed DAC address for comparison with the ADC address. EOCADC<1:8>—input—The end of conversion signal from the ADC. EOCDAC<1:8>—output—The muxed end of conversion signal from the ADC. CLKEN<0:7>—input—The cycle timing signal for checking the LSBs from the DAC. CEN<0:7>—output—The muxed cycle timing signal for checking the LSBs from the DAC. TESTON<0:7>—input—The standard test enable on signal from the DAC. TEST_ON<0:7>—output—The muxed standard test enable on signal from the DAC. ADC_MUX_EN<0:7>—output—The signal that allows the ANALOG_ADCMUX associated with an ADC to be enabled in BIST test mode DAC_MUX_EN<0:7>—output—The signal that allows the ANALOG_DACMUX associated with a DAC to be enabled in BIST test mode. GRND_EN—Shorts the analog bus to ground when a Standard test is not in progress (active high). GRND_ENB—Shorts the analog bus to ground when a Standard test is not in progress (active low).

Figure 10:
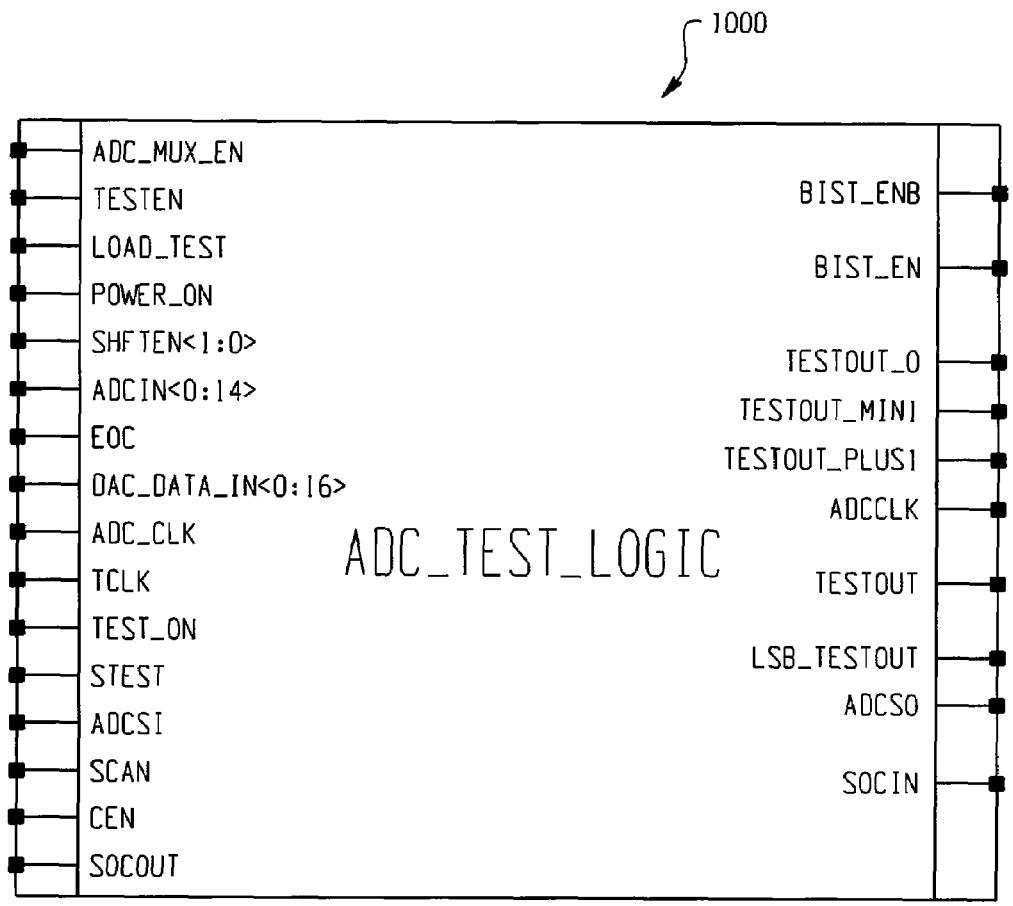
FIG. 10 is an exemplary ADC test logic block.

FIG. 10 is an exemplary ADC test logic block 1000. Each ADC has an ADC Test Logic block 1000 (e.g. ADC Test Logic 204, 222 in FIGS. 2 and 204 in FIG. 3) that is used to control the test of the ADC. The ADC Test Logic has two modes of operation, the Standard mode and the Parametric mode. In the Standard mode a selectable number of the Most Significant Bits (MSBs) (or all) of the addresses from the DAC are compared with the same MSB (or all) addresses from the ADC, as well as ADC addresses within 1 or 2 bits of the input ADC address and the match results reported. The number of MSB address bits compared is controlled by the Shift Enable number. This number can be varied from 0 to 3 eliminating a number of LSB bits from comparison. In this way a less rigorous match in addresses will result in a successful test.

In the Parametric mode an analog voltage is applied at the Pad and the resulting ADC address is registered and shifted out serially.

The choice of Mode bit, a Test-Enable bit, and two Shift Enable bits are input through the STEST, TESTEN and SHFTEN<1:0> inputs respectively using TCLK (the same clock TCLK used for the DAC). The input data is loaded with the LOAD_TEST signal, which is asserted for 1 TCLK cycle when the test inputs are valid. For a standard test with all bits compared (the default start test) STEST=1, TESTEN=1 and SHFTEN<1:0>=00, for the parametric test STEST=0, TESTEN=1 and SHFTEN<1:0>=00. To end either test mode the inputs should be STEST=0 or 1, TESTEN=0 and SHFTEN<1:0>=XX.

In the standard DAC/ADC test, after LOAD_DAC_TEST is asserted BIST_EN/BIST_ENB goes high/low, which enables the ANALOG_DACMUX in test mode. The DAC Test Logic sends the TEST_ON and CEN signals to the ADC Test Logic along with the DAC address (DAC_DATA_IN<0:16>). In this example there are 2 more DAC addresses than ADC addresses (a common occurrence). Thus the 2LSBs from the DAC are treated separately since there are no comparable ADC bits. The MSB address (DAC_DATA_IN<2:16>) is compared with the ADCIN<0:14> address from the ADC. If the compare is successful (they are a close match) The TESTOUT output stays low. The TESTOUT_0, TESTOUT_PLUS1, and TESTOUT_MIN1 outputs give more detail on the accuracy of the match and may be monitored for characterization if desired. If TESTOUT stays low for the entire test plus two TCLK cycles, both the ADC and the DAC pass the standard test.

If the Shift Enable bits are not 00 then fewer MSBs from the DAC and ADC Test Logic will be compared, allowing for a less strict test of ADC/DAC pair. Each increase in the shift enable number reduces the MSBs compared by one. The table of MSB bit number vs. the Shift Enable number is shown below.

| Shift Enable Number | | |
|---|---|---|
| MSB | LSB | DAC Bits Compared with ADC Test Logic Bits |
| 0 | 0 | ALL BITS (eg. All 10 bits from a 10 bit ADC) |
| 0 | 1 | ALL BITS - 1 LSB (eg. The 9 MSBs from a 10 bit ADC) |
| 1 | 0 | ALL BITS - 2 LSBs (eg. The 8 MSBs from a 10 bit ADC) |
| 1 | 1 | ALL BITS - 3 LSBs (eg. The 7 MSBs from a 10 bit ADC) |

If there are more address bits in the DAC than the ADC (as in this example), the ADC Test Logic will indicate if these extra LSB bits are working. When the standard test is complete (TEST_ON goes low and the end test sequence is loaded into the input shift chain) the TESTOUT pin should stay low for two TCLK cycles. The LSB functionality can be monitored if desired by the LSB_TESTOUT pin. In the parametric ADC test, after LOAD_DAC_TEST is asserted BIST_EN/BIST_ENB stays low/high, which keeps the ANALOG_DACMUX in normal mode. The Pad is held at the desired test voltage and an SOCOUT signal is sent to the ADC. TCLK (which becomes ADCCLK) is cycled. ADCIN<0:14> will be loaded to registers in the ADC test logic when the EOC signal from the ADC goes high 18 TCLK clock cycles after SOCOUT goes low. This data can then be shifted out from these registers through the ADCSO by raising SCAN.

The POWER_ON signal insures that the test logic is off at power up (as in the ADC). The normal ADC clock (ADC_CLK) is fed through the test logic so that TCLK may be muxed in as the ADC clock during test. The muxed ADC clock output (ADCCLK) is then fed to the ADC clock input. The SOC (Start Of Conversion) signal (like the clock) is sent to the test logic so it can be muxed with the test circuitry. The muxed SOCOUT signal is sent to the ADC. The SOC is used as a handshake signal with the EOC signal from the ADC. The EOC signal is used as an enable signal for the address registers collecting the ADC data (ADCIN<0:14>) and to restart the ADC conversion cycle by issuing a new SOC signal to the ADC. The EOC signal is also used to clock the LSB shift registers.

The logic pins for ADC_TEST_LOGIC 900 are as follows (see FIGS. 3 and 9).

ADCIN<0:16>—input—The ADC output address.

STEST—input—the Standard/Parametric test input. TESTEN—input—the test initialization input.

SHFTEN<1:0>—inputs—the number of address bits compared during the Standard test. (See table above). POWER_ON—input—The power on rest input pin.

TCLK—input—The test clock input used to load and execute DAC testing.

LOAD_TEST—input—an input pin used to load the test inputs STEST, TESTEN, and

SHFTEN<1:0>. ADC_CLK—input—The normal operation ADC clock input.

ADCCLK—output—The ADC Test Logic clock output to the ADC. BIST_EN, BIST_ENB —outputs—the test output used to control the ANALOG_ADCMUX associated with the ADC under test. ADC_MUX_EN—input—Analog Mux Enable signal from the Digital Mux Block. DAC_DATA_IN<0:16>—input—the address data (DAC test data) output from the DAC Test Logic to the ADC Test Logic. TEST_ON—input—an input that indicates if a DAC test is in progress. CEN—input—An input from the test logic to enable the LSB circuit in the ADC Test Logic at the proper time. EOC (End Of Conversion)—input—An input from the ADC to enable the ADC Test Logic address (ADCIN<0:14>) to load at the proper time. SOCIN—input—The normal function start of cycle input, Start of Conversion Input. SOCOUT —output—The muxed SOC signal to the ADC, Start of Conversion Output. TESTOUT —output—ADC/DAC address compare result (low is passing). (If any of the three following TESTOUT signals is high TESTOUT will be low). TESTOUT_MIN1—output— ADC/DAC address compare minus 1 result. TESTOUT_PLUS1—output—ADC/DAC address compare plus 1 result. TESTOUT_0—output—ADC/DAC address compare plus '0' result. LSB_TESTOUT—output—The signal output that indicates whether the LSBs in the DAC are functioning. SCAN—input—A scan input used to scan data into and out of the ADC ADDIN registers. ADCSI—input— the input for scanning data into the ADC ADDIN registers. ADCSO—output—the output for getting the date out of the ADC ADDIN registers.

Figure 11A:
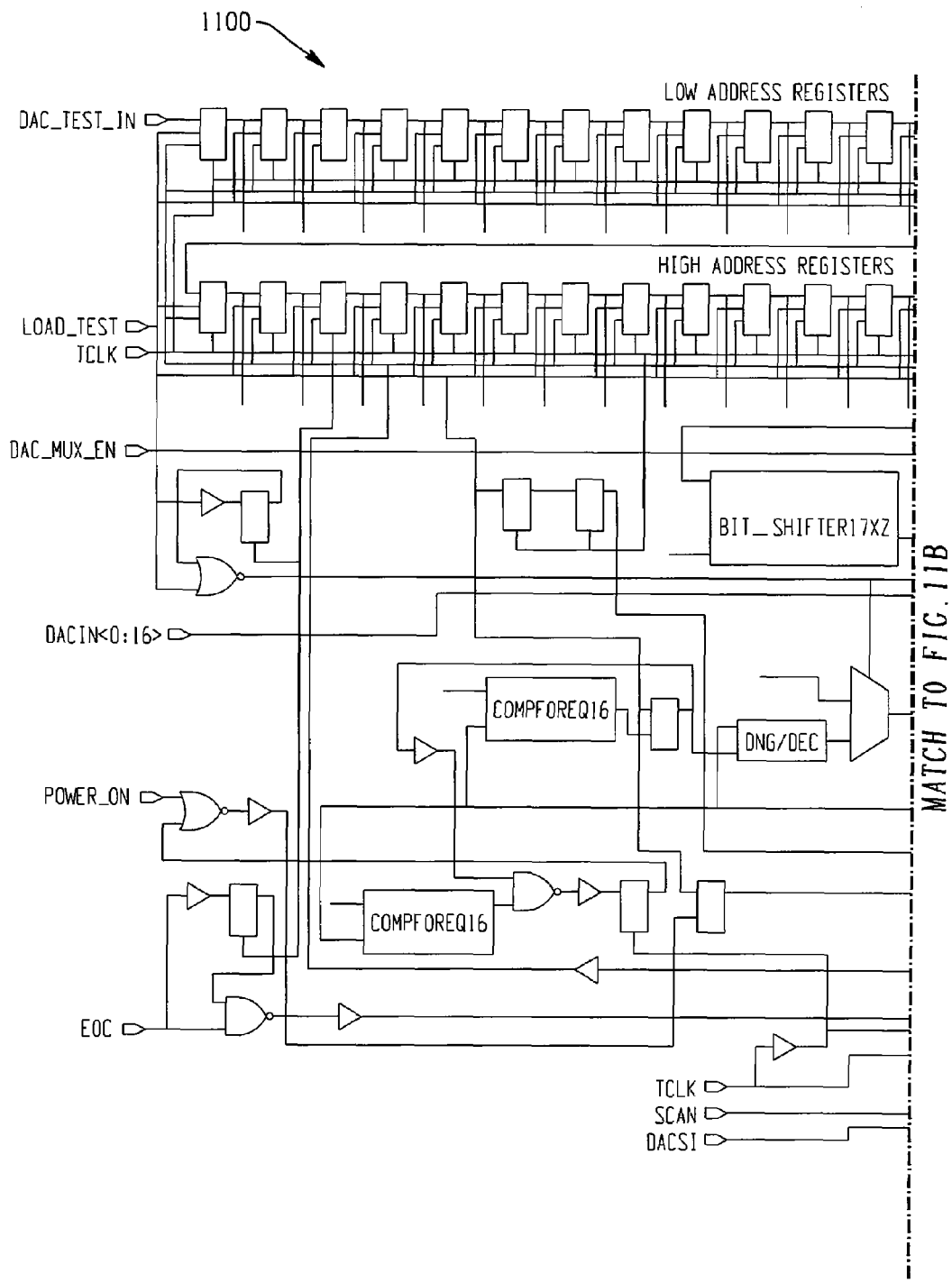
FIG. 11 is a detailed circuit diagram of DAC test logic.
Figure 11B:
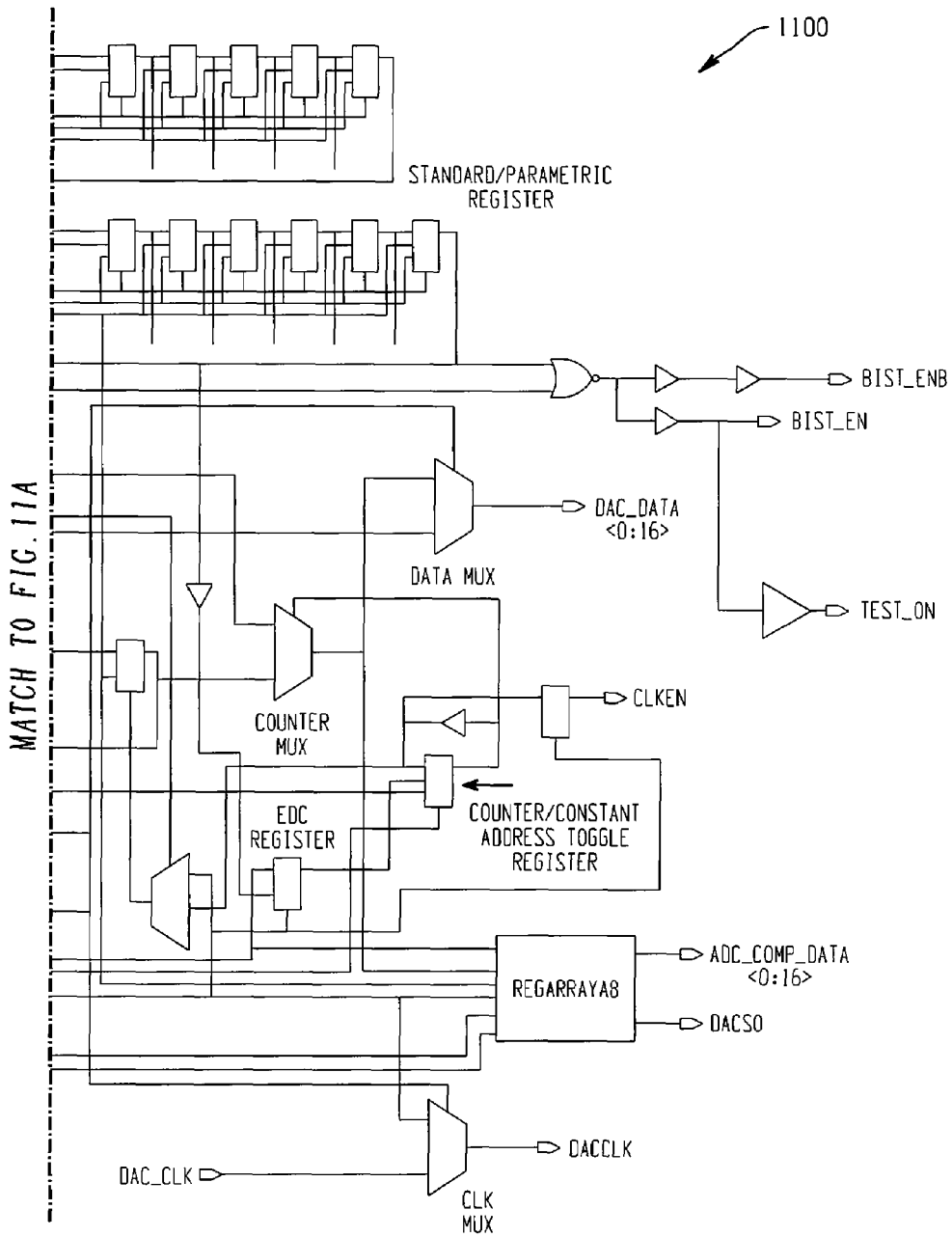

FIG. 11 is a detailed circuit diagram 1100 of exemplary circuits found in DAC test logic 800 (FIG. 8). Starting at the top of the figure, the DAC_TEST_IN serial chain input is fed through a set of 35 flip flops clocked by TCLK. These flip flops are enabled by the LOAD_TEST signal. The outputs of the registers are the PARAM_ENB mode bit, the LBIT<0:16> (LOW ADDRESS) and the DBIT<0:16> (HIGH ADDRESS) test address bits. The LOAD_TEST signal that enables the registers also sets up the test logic. The DATA MUX is switched to send the test generated data out the DAC_DATA address to the DAC and the CLOCK MUX is switched to send TCLK out DACCLK to the DAC. The LOAD_TEST signal also resets the counter to the LBIT<0:16> address and puts it in Increment state as well as resetting the 17 bit comp. register array and resets the TOGGLE REGISTER (reset stays on one extra cycle for correct test initialization). Details of the rest of the test logic are covered in the functional operation descriptions below.

The data loaded in the STANDARD/PARAMETRIC register determines the mode of the test. This first bit of the serial input determines whether the test is to be a Standard ADC/DAC test or a Parametric DAC test. A zero results in a Parametric test and a one in a Standard ADC/DAC test. The Parametric test signal keeps the BIST_EN/BIST_ENB output low/high (normal mode) and switches the SHFTEN of a divide-by-2 shifter circuit to the 'no divide' setting so that the DBIT<0:16> goes to the COUNTER MUX. The Parametric test signal (PARAMEN) also continually sets the EOC REGISTER so that the TOGGLE REGISTER will toggle on each rise of TCLK. The TOGGLE REGISTER is reset to a zero so that the COUNTER MUX will send the count data (CNT<0:16>=LBIT<0:16>) out as the first DAC address. When TCLK rises the TOGGLE REGISTER will switch the COUNTER MUX so the DBIT<0:16> input address is sent to the DAC. This way any low DAC analog voltage and any high DAC voltage may be measured.

The voltage measurement of a digital address may be determined in two ways. The first way is to use the DAC_TEST_IN to shift the desired address into the serial registers (LOW or HIGH ADDRESS registers as discussed above). The second way is to keep cycling TCLK and use the counter to increment to the desired address (or look at all the voltage levels if desired).

The test mode may be terminated by raising the POWER_ON signal or cycling TCLK through the increment/decrement counter levels until the LBIT<0:16> address is reached, where the test will automatically reset.

For the standard test the serial chain input bit is first a one, to set the STANDARD/PARAMETRIC REGISTER, followed by the highest address to be tested (the HIGH ADDRESS=DBIT<0:16>), followed by the lowest address to be tested (the LOW ADDRESS=LBIT<0:16>). When the registers are loaded the PARAM_ENB signal will switch the BIST_EN/BIST_ENB to a high/low. This redirects DAC output through the ANALOG_DACMUX onto the ANALOGTESTBUS and also sends a TEST_ON signal to the ADC Test Logic (or wherever it is needed) to indicate an ADC/DAC standard test has begun. The DBIT<0:16> go through the shift by 2 circuit where the divide by 2 will take place, to the 0 input of the COUNTER MUX. The DBIT<0:16> also goes to the input of the COMPFOREQ circuit in the counter. The PARAMEN signal goes low so that there will be no Set of the EOC REGISTER (clocked by TCLK Bar). The result is that the TOGGLE REGISTER will only change state when the registered EOC signal goes high (once every 20 TCLK cycles). In this way the same DAC address is sent to the DAC for 20 TCLK cycles. The EOC signal also enables the load of the DAC address into the REGARRAY16. The output of this register array is sent out as ADC_COMP_DATA<0:16> to the ADC under test. The TOGGLE REGISTER alternates the COUNTER MUX between the increment/decrement counter and the DBIT<0:16>/2 DAC address (The DBITS are shifted down by one—effectively dividing the DBIT address by 2). The bar of the TOGGLE REGISTER output is buffered and sent to the ADC as CLKEN. The counter again starts at the LBIT<0:16> value and increments to the DBIT<0:16> value (alternating with the half level of DBIT<0:16>/2). When the DBIT<0:16> address is reached in the counter the increment signal is switched to a decrement signal and the counter counts down to the LBIT<0:16> (again alternating with the DBIT<0:16>/2 address). Upon reaching the LBIT<0:16> address the test is terminated by a RESET signal generated by the counter. This signal will reset the DAC_TEST_LOGIC circuit. The circuit is also reset on power up by the POWER_ON input signal.

Figure 12:
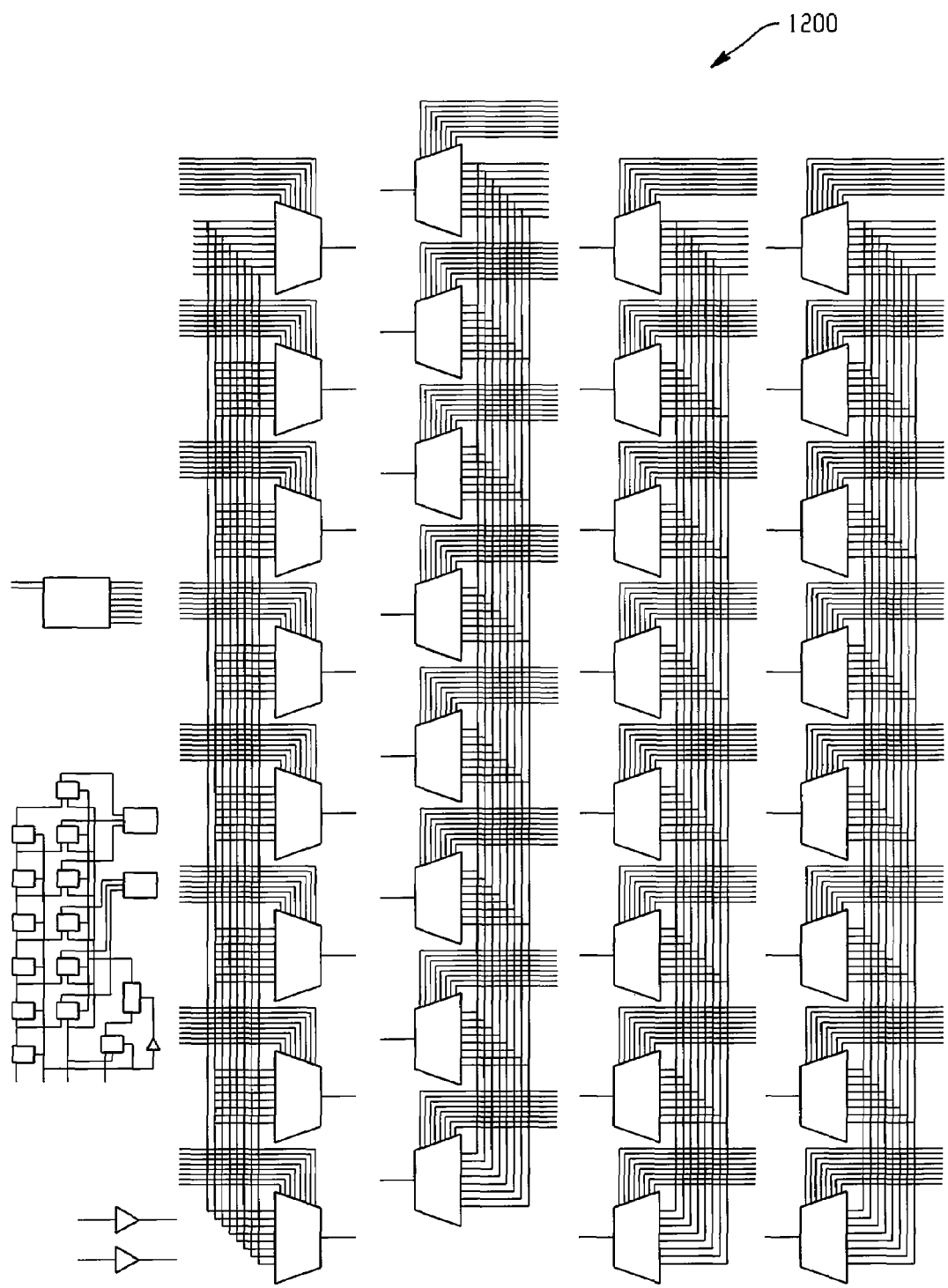
FIG. 12 is an example detailed circuit diagram for a test multiplexer.

FIG. 12 is an example detailed circuit diagram 1200 for a test multiplexer, such as test multiplexer 206 (FIGS. 2 and 3). The circuit consists of a short 6 bit serial shift chain with six shadow registers. The input to the serial chain is MUX_TEST_IN and the registers are clocked by TCLK. The load is accomplished though the LOAD_MUX_TEST input. The first three registers hold the decode bits that determine which DAC to test (LSB first) and the second three registers hold the decode bits that determine which ADC to test. The outputs of these registers are fed to 3 to 8 decoders and then to a 16 to 64 decoder that enable the proper mux connections for the DAC/ADC Standard Test. The outputs of the 3 to 8 ADC and DAC decoders are fed to the ADC and DAC Test Logic respectively as MUX ENABLE signals. These signals insure that only one ANALOG_DACMUX and one ANALOG_ADCMUX can be in BIST Test mode at a time (That only one ANALOG_DACMUX BIST_EN and one ANALOG_AD-CMUX BIST_EN will be turned on). The POWER_ON signal resets the shadow registers so that the first DAC is muxed to the first ADC.

Figure 13A:
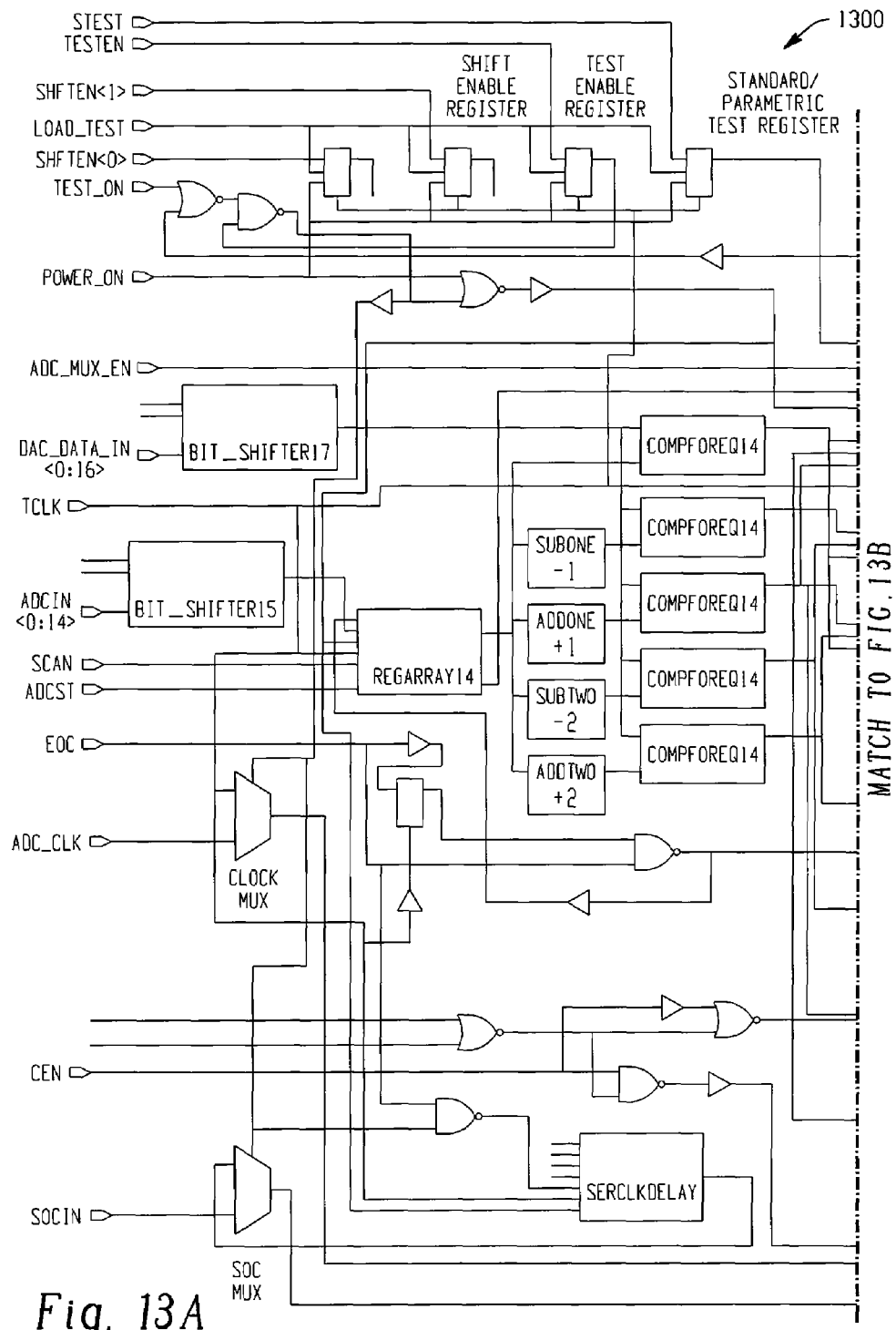
FIG. 13 is an example detailed circuit for ADC test logic.
Figure 13B:
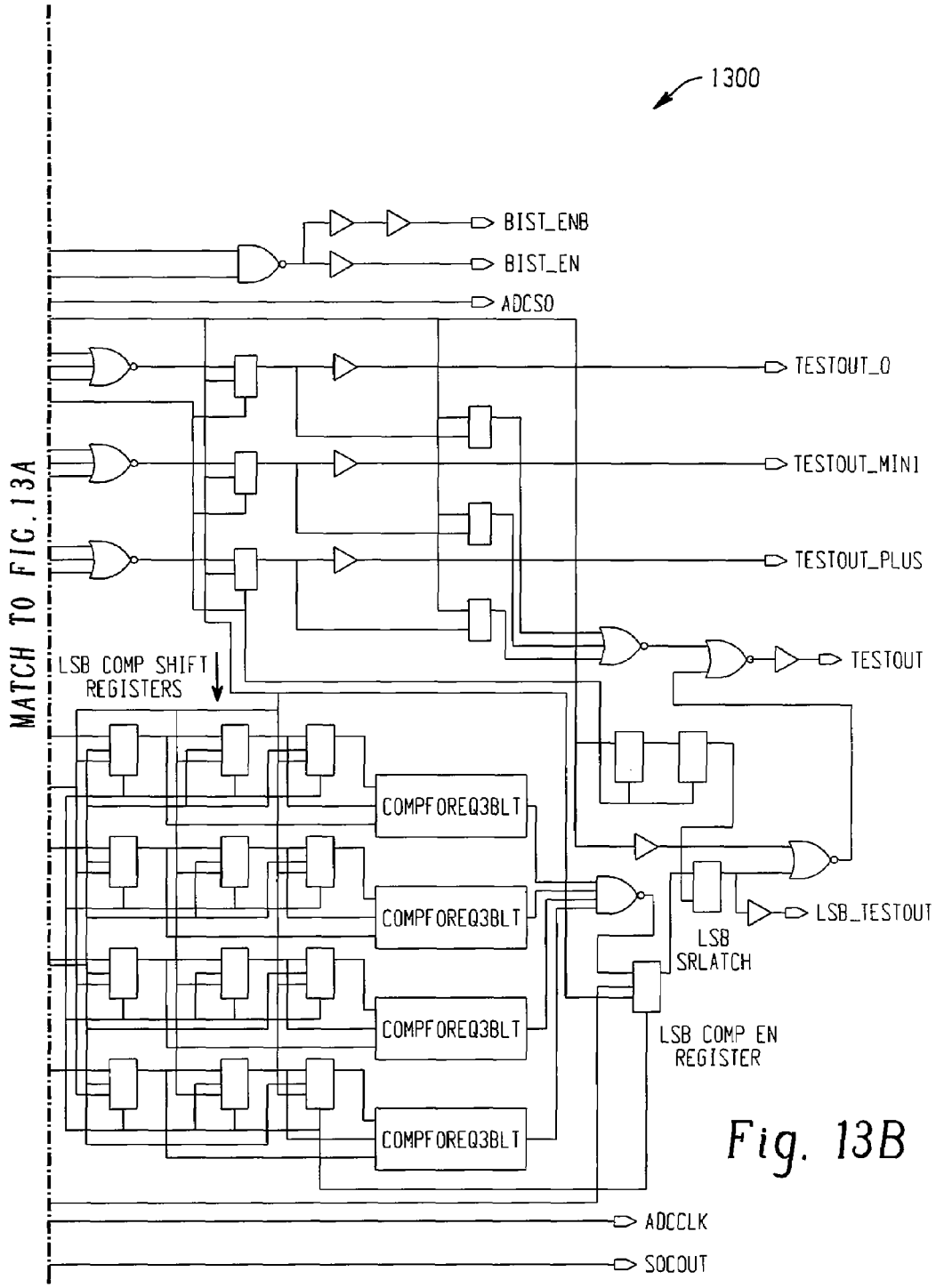

The details of the ADC Test Circuit 1300 are shown if FIG. 13. There is no serial register chain. The STEST input sets the STANDARD/PARAMETRIC TEST, the TESTEN input sets the TEST ENABLE and the SHFTEN<1:0> inputs set the shift bits for the compare shifters (BIT_SHIFTER15 and BIT_SHIFTER17). The input registers are clocked by TCLK and loaded by LOAD_TEST. The high output of the TEST_EN register and a high on the TEST_ON input switch the internal CLOCK MUX and the SOC MUX so that TCLK and the SOC signal generated in the test logic are sent to the ADC through ADCCLK and SOCOUT instead of the normal functional inputs ADC_CLK and SOCIN.

For the standard test a one is loaded into the TEST_EN register, a one is loaded into the STEST register to start the test and the Shift Enable registers are both loaded with zeros (for example—if all address bits are to be compared). The ADC LOAD_TEST signal must fall at the same TCLK cycle as the DAC LOAD_TEST signal for proper initial timing. The STANDARD/PARAMETRIC bit being high will cause the BIST_EN/BIST_ENB output to be high/low so that the ADC input will be selected from the ANALOGTESTBUS rather than from the Pad input by the ANALOG_ADCMUX.

The addresses from the ADC (ADCIN<0:14>) are loaded into a register array enabled by EOC via the ADC Bit Shift circuit BIT_SHIFTER15. The EOC signal from the ADC indicates when the ADC output is valid. The address output of this ADCIN Register Array (REGARRAY14) is sent to several Add and Subtract Circuits [the SUBONE (−1), SUBTWO (−2), ADDONE (+1) and ADDTWO (+2) circuits] where one or two LSB bits are added or subtracted yielding 'small error' addresses. The registered address and the small error addresses are compared (5 Compare-for-Equal Circuits) to the 'correct' Bit Shifted address (by BIT_SHIFTER17) from the DAC. The DAC address (DAC_DATA_IN<2:16>) is simultaneously clocked (the same TCLK cycle) to the ADC Test Logic by TCLK and the EOC signal. The BIT SHIFTED MSBs (15 bits in this example) from the DAC are compared with the BIT SHIFTED address of the ADC. The results of the 5 Compare-for-Equal Circuits are ORed to the outputs TEST-OUT_0, TESTOUT_MIN1 and TESTOUT_PLUS1 through registers. These outputs test for a + or −1 LSB offset between the ADC and DAC addresses as well as allowing for a + or −1 LSB error in the address compare. If any of these 3 TESTOUT outputs stay high throughout the test then the main output TESTOUT stays low. If the output TESTOUT stays low for the entire test address sequence the DAC and ADC pass.

Two and a half TCLK cycles after the EOC signal is received (on a TCLK low) from the ADC the test logic sends out a Start of Conversion signal to the ADC (SOCOUT). The 2.5 cycle delay is needed to allow the DAC to send a new analog voltage to the ADC. The compare of ADC and DAC addresses take one cycle (cycle 0), the input of a new address to the DAC takes a second cycle (cycle 1) and the setup of the analog voltage on the ANALOGTESTBUS takes the third cycle (cycle 2). The two LSB addresses from the DAC Test Logic (DAC_DATA_IN_LSB<0:1>) are 'tested-' by a separate circuit. This circuit requires a CEN signal from the DAC Test Logic, as well as the EOC signal from the ADC, for proper timing. The CEN signal only allows the LSB COMP SHIFT REGISTERS (clocked by the EOC Bar signal-) to be enabled when the counter address is sent from the DAC Test Logic. If either of the LSBs is a one and CEN is high when EOC Bar rises then the compare results from the Subtract and Add Circuits are loaded into the LSB COMP SHIFT REGISTERS. There are three registers because three LSB bit patterns have a one –01, 10 and 11. The shifted data from the LSB COMP SHIFT REGISTERS is compared in four 3 bit Compare-For-Equal Circuits. The result of these compares is NANDed to the input of the LSB COMP EN REGISTER. When both LSB bits are low (00) and CEN is high and EOC Bar goes high this register is loaded and the NAND result is sent to the RESET input of a SET/RESET latch. This latch was SET during the test off time. At the end of the test sequence when TEST_ON goes low the TESTOUT output should stay low for two additional TCLK cycles to indicate that the LSBs are working. The LSB_TESTOUT signal may be monitored to see if the LSBs are functioning. If, at the end of the test sequence, the LSB_TESTOUT has gone low then the compare outputs to the LSB COMP SHIFT REGISTERS are not the same as a result of the LSBs changing. The low output is a good indication that the LSB bits are functioning in the DAC.

Unlike the DAC Test Logic there is no automatic reset for the ADC Test Logic since it is essentially a passive circuit. To reset the ADC Test Logic after the standard test (and the parametric test) the TESTEN input must be loaded with a 0. The circuit will reset when LOAD_TEST is brought high.

For the parametric test a zero is input to the STANDARD/ PARAMETRIC TEST REGISTER from STEST, a one is input to the in the TEST ENABLE REGISTER from TES- TEN and zeros are sent to the shift register inputs from SHFT<1:0>. The LOAD_TEST high signal (for one TCLK cycle) enables the registers resulting in a low on PARA- M_ENB which will keep the BIST_EN/BIST_ENB low/ high. Thus the analog voltage from the Pad will be fed to the ADC. The ADCCLK and the SOCOUT outputs are muxed so that the ADCCLK is TCLK and the SOCOUT signal is generated by the ADC Test Logic. The Ored TEST_EN signal will send an SOC signal to the ADC four TCLK cycles after LOAD_TEST is brought high (the time allowed to get the desired analog voltage on the Pad input). TCLK is cycled until EOC goes high to load the Register Array (REGARRAY15). After EOC goes low the SCAN signal is raised to shift the register array data out through the ADCSO output. During this time (two cycles after EOC goes high) another SOC signal will be delivered to the ADC. During these two cycles another analog voltage is applied to the Pad for the next test. Again to terminate the test mode and reset the test logic a zero must be loaded into the TEST ENABLE REGISTER with the LOAD_TEST signal.

The additional resistance of the Analog Muxes, adds an RC filter in the DAC output path and the ADC input path. This additional RC could limit the top frequency of opera- tion for the DACs and ADCs. The internal Analog Test Bus should have low resistance and capacitance (especially if there are a large number of DACs and ADCs muxable to the bus). If there are too many ADC and DAC Analog Muxs on the Test Bus the Test Bus capacitive load might limit the test frequency. The ANALOGTESTBUS should be noise free during test. Third, the reference voltages for the DACs and ADCs should be well matched, although the test scheme will allow for small voltage discrepancies. Some digital circuit modification will be required for testing other types of DACs and ADCs. Fourth, if the DAC and ADC under test have a large frequency or bit number difference testing to the specification limits can be difficult.

In order to test a Pipeline or Flash DAC some changes in the test clock generation and connections are necessary. Also the test signals coming from the DAC Test Logic going to the ADC Test Logic must be delayed by the number of cycles of latency in the ADC.

Figure 14:
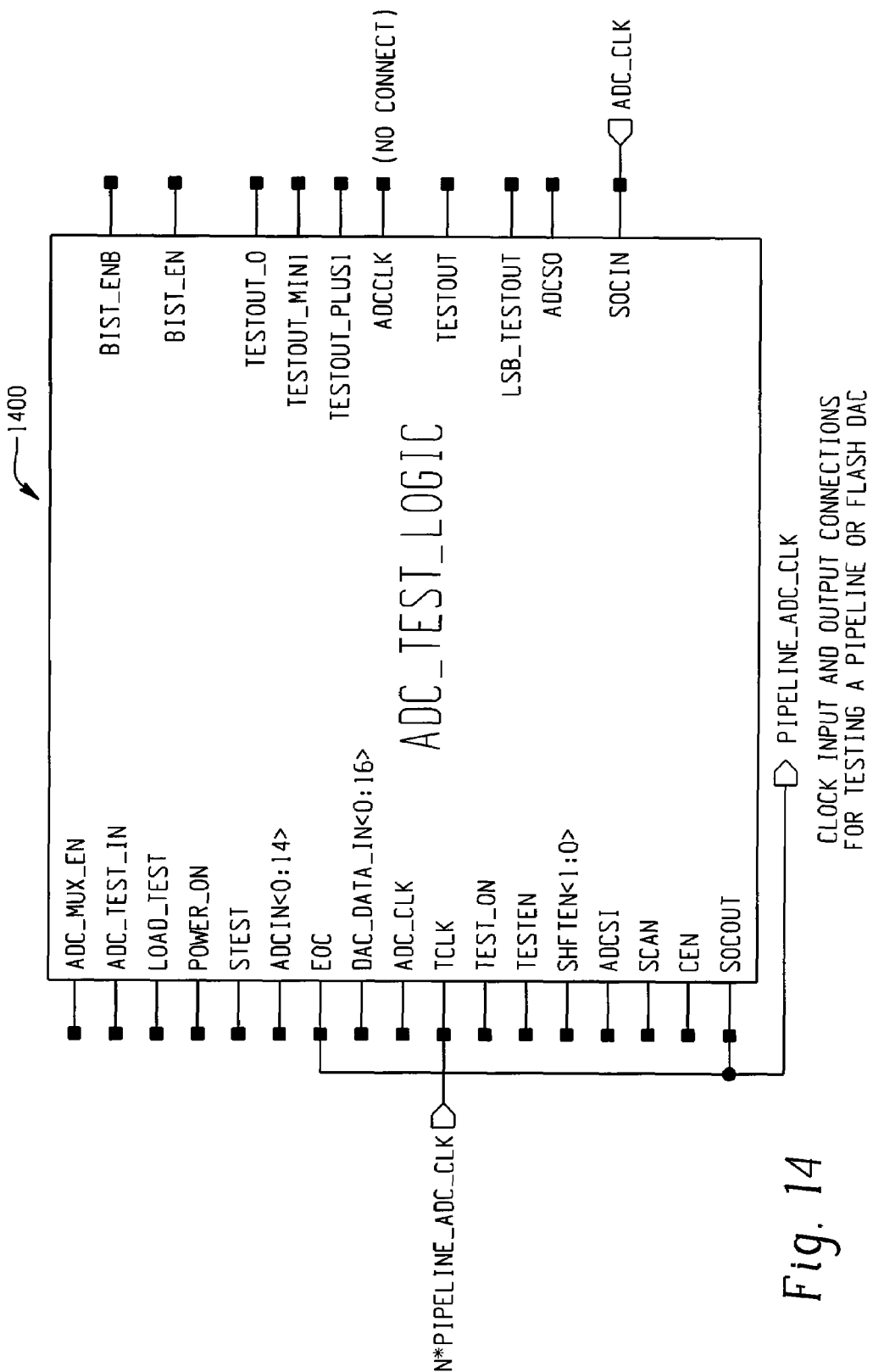
FIG. 14 is an example ADC test logic block for testing a pipeline or flash DAC.

The Start and End of Conversion signals (SOC and EOC) used in the Successive Approximation ADC will not be present in the Pipeline or Flash ADCs. These ADCs only have an Analog input and a clock for controlling operation. The SOCOUT from the ADC Test Logic can be used as the Pipeline ADC Clock and fed back to the EOC input as shown in FIG. 14.

Figure 15:
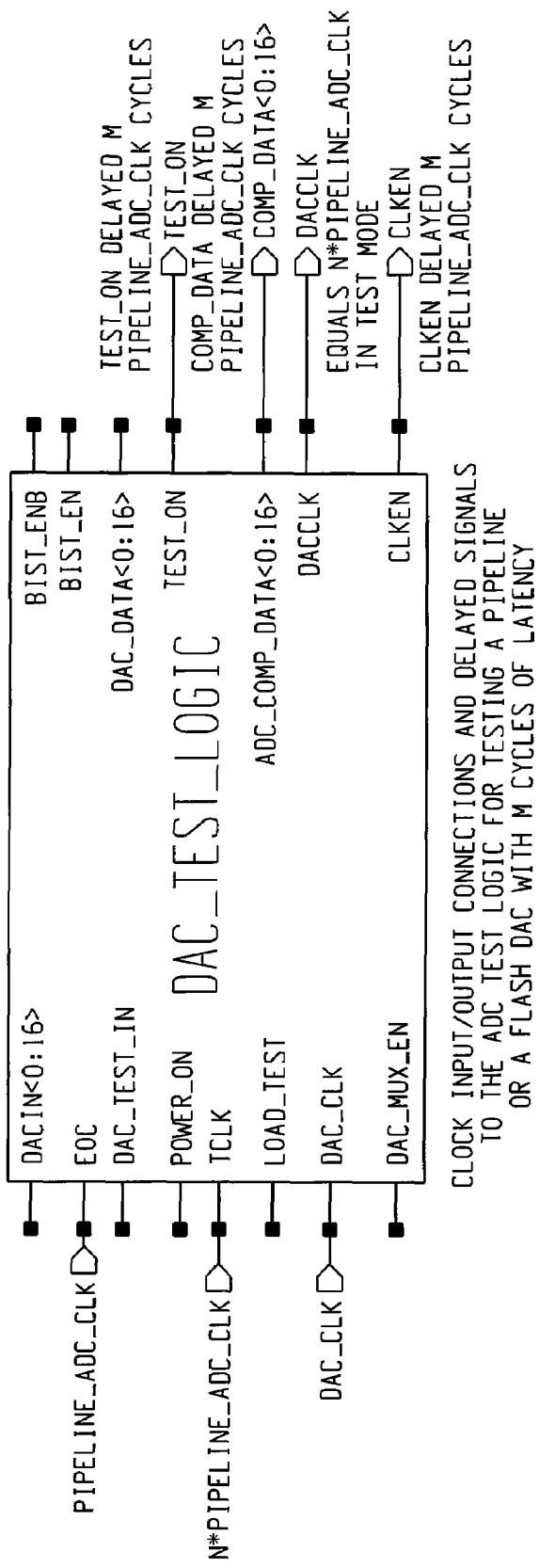
FIG. 15 is an example detailed circuit for an ADC test logic block for testing a pipeline or flash DAC.

The TCLK input will be an even multiple (N) of the PIPELINE_ADC_CLK. The value of N can be set by the serially loaded ADC_TEST_IN data. The block diagram is shown in FIG. 15. The normal ADC clock input ADC_CLK is not used. The normal clock is input to SOCIN and the output ADCCLK floats.

The test serial data in has 4 registers to control the value of N by setting the delay of the new SERCLKDELAY circuit, which replaces the three delay registers used in the previous ADC Test Logic. The new EOC to SOCOUT clock loop can be set from 2 (where the registers are loaded with 0000) to 32 TCLK cycles (where the registers are loaded with 1111). ALL the other circuits in the ADC Test Logic operate in same fashion as with the Successive Approxima- tion ADC Test Logic.

A lower gate count solution to the variable N clock divide would be to make the Serial Clock Delay programmable in the RTL so that only N/2 serial registers would be added in the SERCLKDELAY circuit. This RTL solution would be the preferred implementation since then no ADC_TEST_IN serial path would be needed.

Figure 16A:
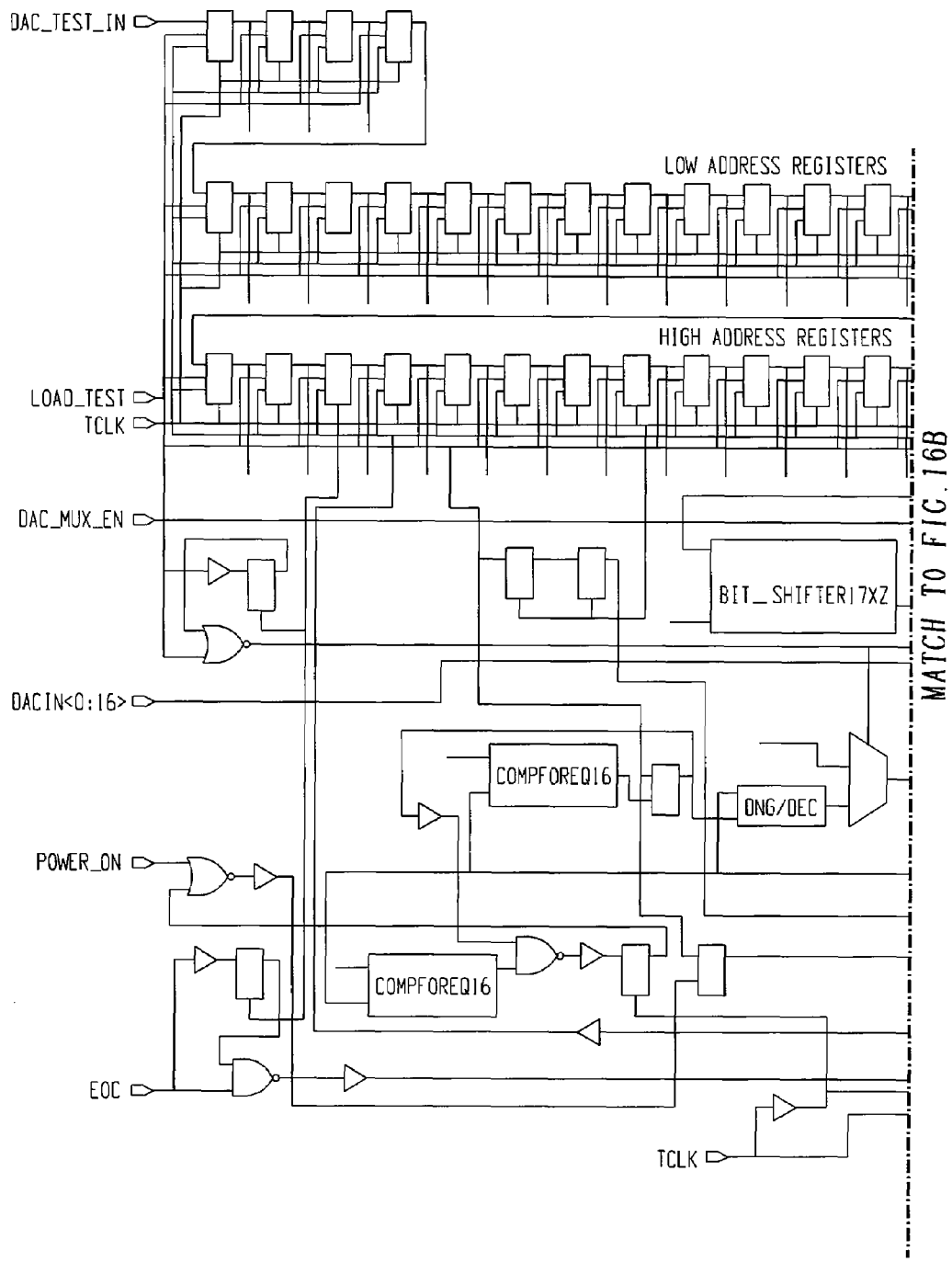
FIG. 16 is an example DAC test logic block for testing a pipeline or flash DAC.
Figure 16B:
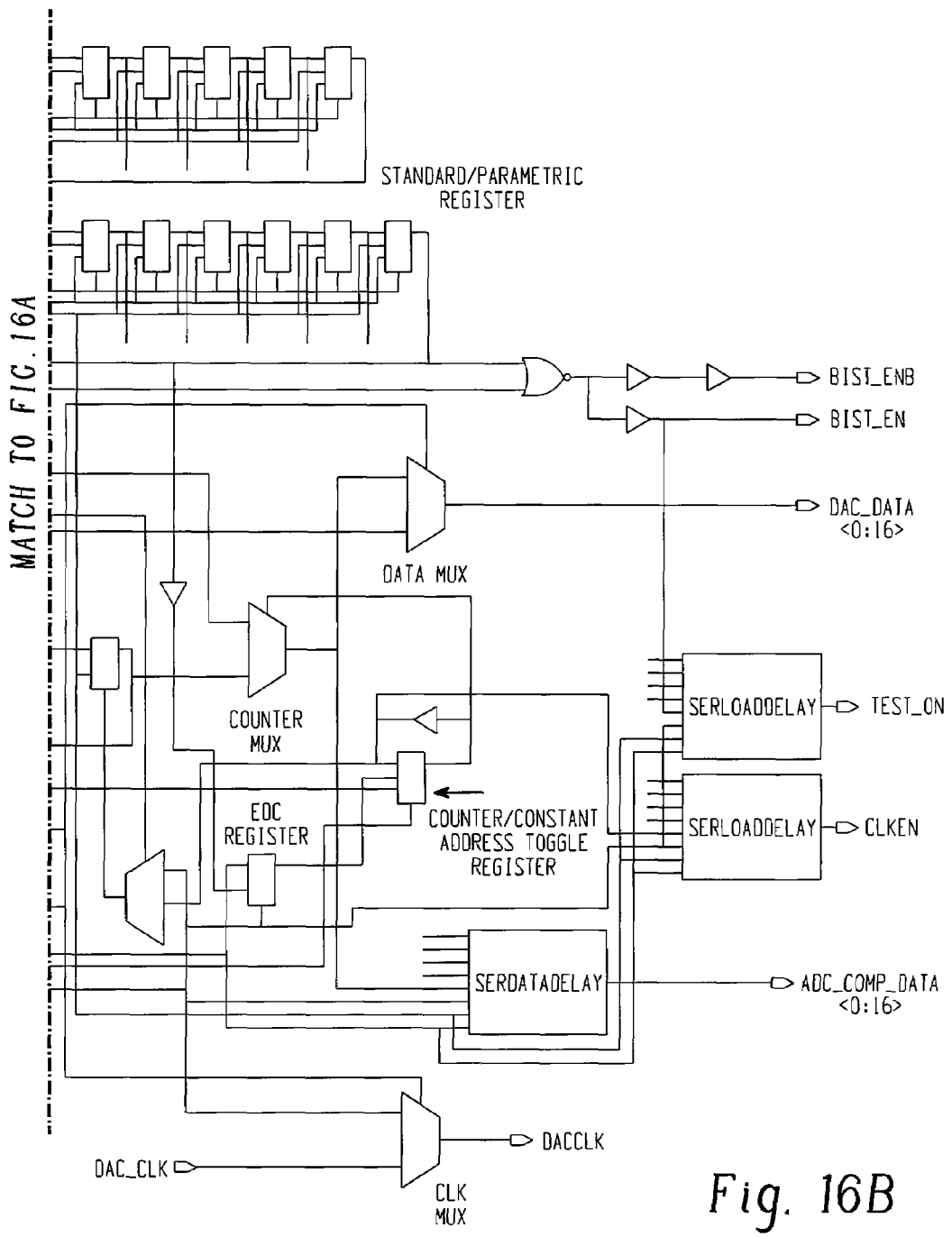

The clock generated in the ADC Test Logic is used in the DAC Test Logic to sync the two test blocks. The ADC or DAC under test with the lowest maximum frequency will determine the clock frequency used. The other essential change to the DAC Test Logic is that the signals going to the ADC Test Logic must be delayed by the number of latency cycles in the ADC so that the addresses to be compared will arrive at the proper times. The new clocking and delayed data outputs are shown in FIG. 16. The DACCLK input will be at the higher frequency N*PIPELINE_ADC_CLK rate but the DAC_DATA<0:16> will change at the lower fre- quency PIPELINE_ADC_CLK rate.

As long as there is no adverse effect from the higher clock rate, the effective clock rate (the rate at which the addresses change) should determine the upper frequency limit.

Figure 17A:
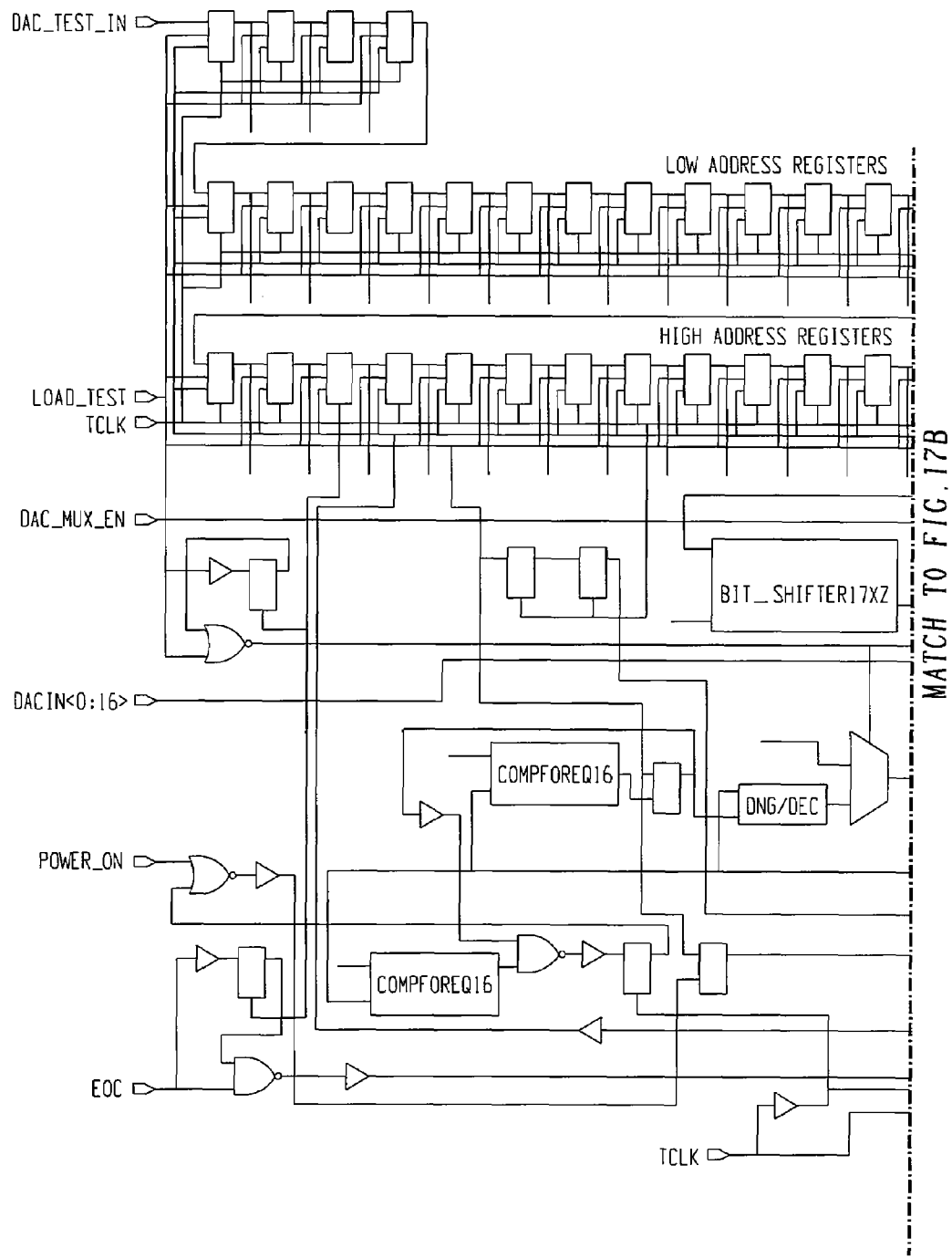
FIG. 17 is an example detailed circuit for an DAC test logic block for testing a pipeline or flash DAC.
Figure 17B:
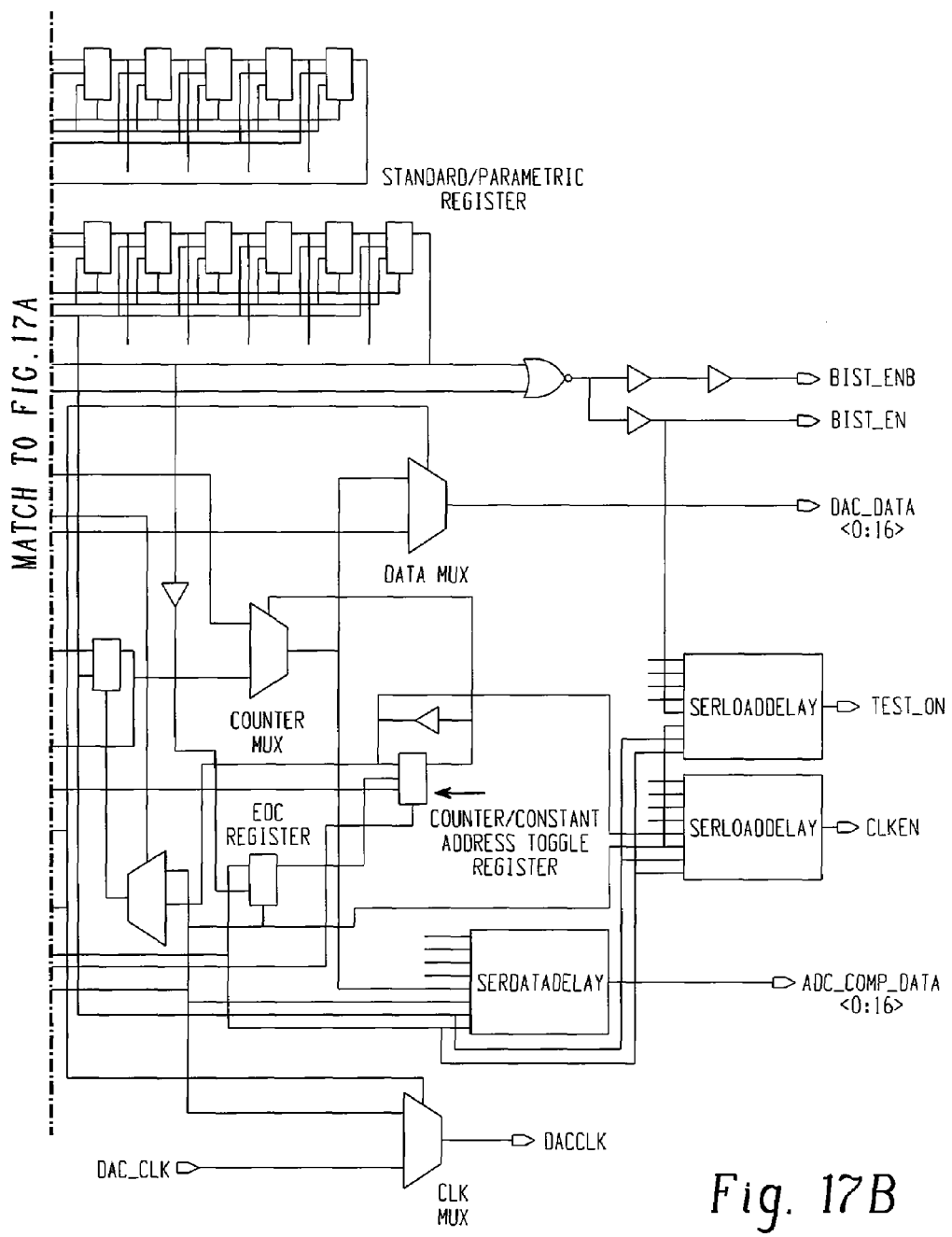

In order to delay the CLKEN, TEST_ON and ADC_COMP_DATA<0:16> outputs serial delay circuits similar to the ones used in the ADC Test Logic clock circuit are used to achieve delays from 1 cycle to 16 cycles (See FIG. 17).

As with the ADC Test Logic 4 more DAC_TEST_IN serial registers are used to program the number of latency delay clock cycles. However in the DAC Test Logic case many more (potentially unused) delay registers would be needed if the programmable RTL approach discussed above is not used. Thus again the preferred solution would be to have programmable serial delay cells written in RTL for the CLKEN, TEST_ON and ADC_COMP_DATA<0:16> out- puts. With this addition the circuit used would also be the same as with the Successive Approximation DAC Test Logic except for the extra delay registers.

Some signal and timing changes may be required in the DAC Test Logic 1100 (FIG. 11) if the Successive Approxi- mation ADC has a much higher clock rate than the DAC used to test it. For this modification to work the DAC must still have a higher maximum clock rate than the EOC (End Of Conversion) to EOC time of the ADC. Typically 10 to 20

ADC clock cycles are required between EOC signals so the effective clock rate of the ADC is much lower thus if

MINIMUM DAC CLOCK PERIOD>=TIME PERIOD BETWEEN EOC RISING EDGES

Where the

PERIOD BETWEEN EOC RISING EDGES=(ADC CLOCK PERIOD)*(CONVERTION CLOCK CYCLES+$N$ SOC HIGH CYCLES)

where N>=1 the modified circuit will work.

Figure 18A:
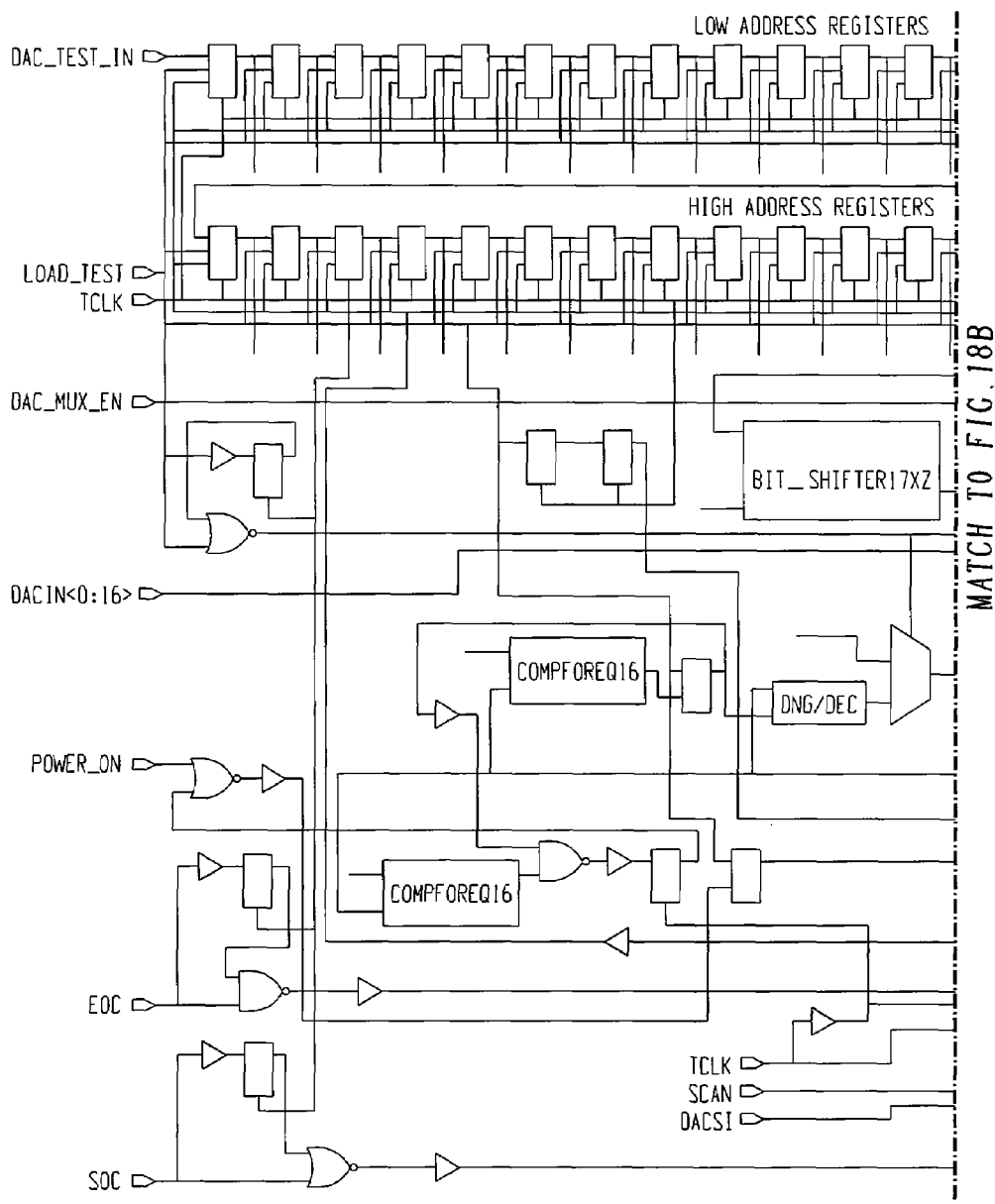
FIG. 18 is an example detailed diagram of a DAC Test Logic Block to test a fast Successive Approximation DAC.
Figure 18B:
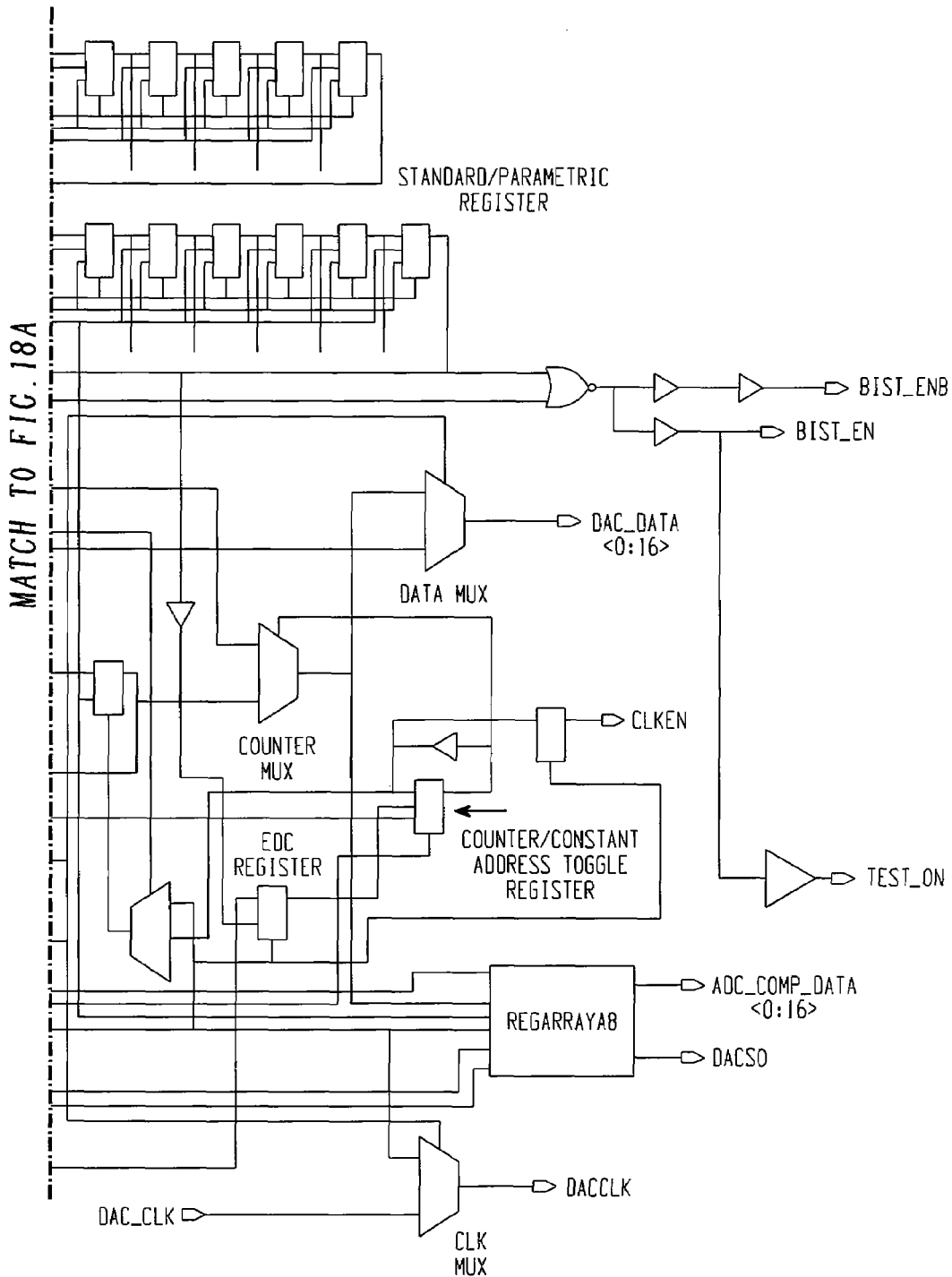

One additional signal (SOCOUT) must be sent to the DAC Test Logic from the ADC Test Logic. This will require another digital mux in the Digital Mux Circuit to steer the selected ADC Test Logic SOCOUT to the proper DAC Test Logic. The circuit changes and how the new SOCOUT input is used is shown in FIG. 18.

Figure 19:
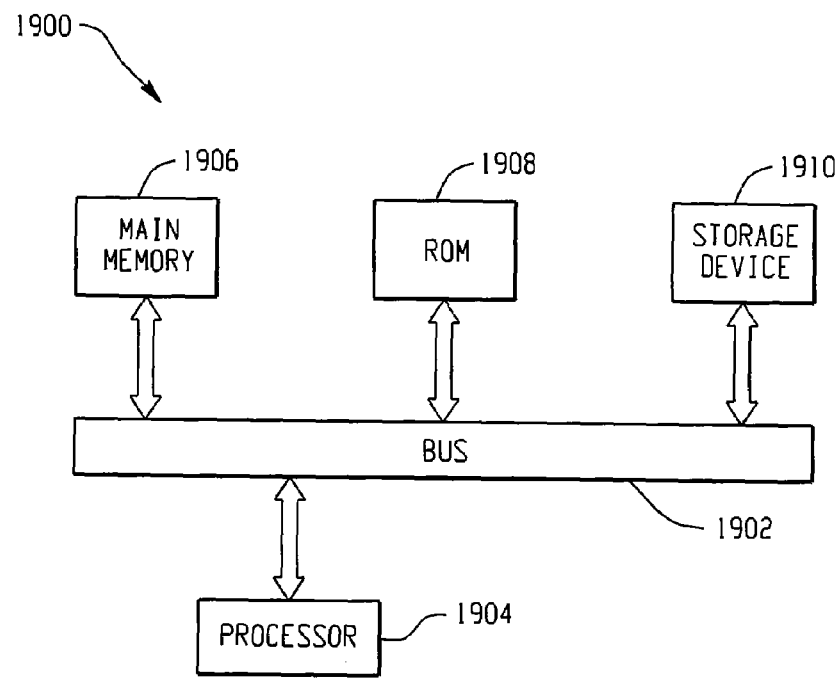
FIG. 19 is a computer system used to implement an aspect of the present invention.

FIG. 19 is a block diagram that illustrates a computer system 1900 upon which an embodiment of the invention may be implemented. Computer system 1900 can be used to implement Test multiplexer 206, DAC Test Logic 202, ADC Test Logic 204, DAC Test Logic 214 and ADC Test Logic 222 in FIG. 2; DAC Test Logic 202, ADC Test Logic 204 and Digital_Mux_Block 206 in FIG. 3; DAC_TEST_LOGIC 800 in FIG. 8 DIGITAL_MUX_BLOC 900 in FIG. 9; and/or ADC_TEST_LOGIC 1000 in FIG. 10. Computer system 1900 includes a bus 1902 or other communication mechanism for communicating information and a processor 1904 coupled with bus 1902 for processing information. Computer system 1900 also includes a main memory 1906, such as random access memory (RAM) or other dynamic storage device coupled to bus 1902 for storing information and instructions to be executed by processor 1904. Main memory 1906 also may be used for storing a temporary variable or other intermediate information during execution of instructions to be executed by processor 1904. Computer system 1900 further includes a read only memory (ROM) 1908 or other static storage device coupled to bus 1902 for storing static information and instructions for processor 1904. A storage device 1910, such as a magnetic disk or optical disk, is provided and coupled to bus 1902 for storing information and instructions.

The invention is related to the use of computer system 1900 for digital BIST for ADC/DAC circuits. According to one embodiment of the invention, for digital BIST for ADC/DAC circuits is provided by computer system 1900 in response to processor 1904 executing one or more sequences of one or more instructions contained in main memory 1906. Such instructions may be read into main memory 1906 from another computer-readable medium, such as storage device 1910. Execution of the sequence of instructions contained in main memory 1906 causes processor 1904 to perform the process steps described herein. One or more processors in a multi-processing arrangement may also be employed to execute the sequences of instructions contained in main memory 1906. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 1904 for execution. Such a medium may take many forms, including but not limited to non-volatile media, volatile media, and transmission media. Non-volatile media include for example optical or magnetic disks, such as storage device 1910. Volatile media include dynamic memory such as main memory 1906. Transmission media include coaxial cables, copper wire and fiber optics, including the wires that comprise bus 1902. Transmission media can also take the form of acoustic or light waves such as those generated during radio frequency (RF) and infrared (IR) data communications. Common forms of computer-readable media include for example floppy disk, a flexible disk, hard disk, magnetic cards, paper tape, any other physical medium with patterns of holes, a RAM, a PROM, an EPROM, a FLASHPROM, any other memory chip or cartridge, a carrier wave as described hereinafter, or any other medium from which a computer can read.

Various forms of computer-readable media may be involved in carrying one or more sequences of one or more instructions to processor 1904 for execution. For example, the instructions may initially be borne on a magnetic disk of a remote computer. The remote computer can load the instructions into its dynamic memory and send the instructions over a telephone line using a modem. A modem local to computer system 1900 can receive the data on the telephone line and use an infrared transmitter to convert the data to an infrared signal. An infrared detector coupled to bus 1902 can receive the data carried in the infrared signal and place the data on bus 1902. Bus 1902 carries the data to main memory 1906 from which processor 1904 retrieves and executes the instructions. The instructions received by main memory 1906 may optionally be stored on storage device 1910 either before or after execution by processor 1904.

Figure 20:
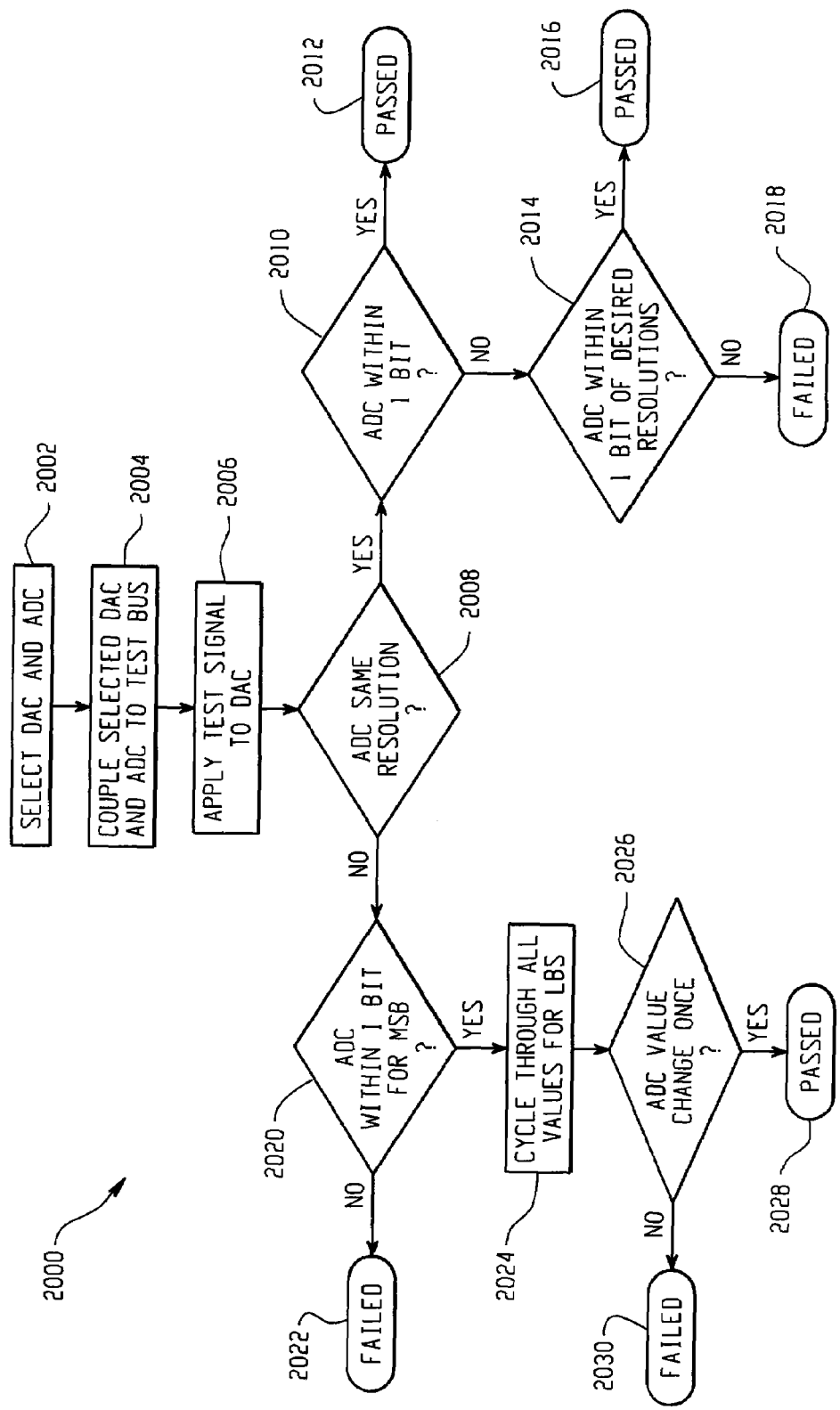
FIG. 20 is a methodology in accordance with an aspect of the present invention.

In view of the foregoing structural and functional features described above, a methodology in accordance with various aspects of the present invention will be better appreciated with reference to FIG. 20. While, for purposes of simplicity of explanation, the methodology of FIG. 20 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention. Embodiments of the present invention are suitably adapted to implement the methodology in hardware, software, or a combination thereof.

Referring to FIG. 20, there is illustrated a methodology 2000 in accordance with an aspect of the present invention. At 2002, a DAC and ADC for testing are selected. For a system that has one DAC and a plurality of ADCs, then the same DAC will be used to test each ADC and conversely for a system with a plurality of DACs and one ADC the same ADC will be used to test the plurality of DACs. For a system that has a plurality of DACs and a plurality of ADCs, any DAC or ADC can be selected. However, considerations, such as whether the resolution of the DAC matches the resolution of the ADC can be employed to determine the selection of the DAC and ADC to be tested. For example, if the DAC being tested is an 8 bit DAC, an 8 bit (or greater) ADC can be selected for the test.

At 2004 the selected DAC and ADC are coupled to the test bus. For systems, such as illustrated in FIGS. 1-2, a multiplexer or other controllable switching device can be switched to couple the DAC and ADC to the test bus. If the test bus was grounded, the controllable switching device coupling the test bus to ground is switched so that the test bus is no longer grounded. For testing purposes, not more than one DAC and one ADC are coupled to the test bus at the same time, even though the DAC and ADC may be tested multiple times, e.g. a DAC can be used to test multiple ADCs.

At 2006, a test signal is applied to the DAC. The value for the test signal can be generated by testing logic coupled to the DAC. The test logic for selecting the DAC and ADC selects the test values.

At 2008, it is determined whether the DAC and the ADC being tested have the same resolution. For example if an 8 bit DAC is being tested, an 8 bit ADC would have the same resolution.

If at 2008 it is determined that the DAC and ADC have the same resolution, at 2010 the output of the ADC is compared with the test value. If the output of the ADC is within one bit (the least significant bit) of the test value (YES), the DAC and ADC have passed the test as shown at 2012. For example, if a test value of 11110000 is applied, then an ADC output of 11101111 (−1 bit), 11110000 (equal) or 11110001 (+1 bit) is considered passing.

If at 2010 it is determined that the ADC value is not within one bit of the test value, at 2014 it is determined whether the ADC output is within 1 bit of the desired resolution, i.e. a desired number of most significant bits (MSBs) are within 1 bit. For example, if only 6 bits of resolution are desired and an 8 bit ADC is used, then as long as the first 6 bits of the ADC output are within 1 bit of the first 6 bits of the test value (YES), then the DAC/ADC pair passed the test as shown at 2016. For example if test value of the test signal is 101010 and the ADC is an 8 bit output, then if the first 6 bits of the ADC are 101001 (−1 bit), 101010 (equal) or 101011 (+1 bit), the DAC/ADC pair passed the test. The least significant bits (LSBs) of the ADC output are ignored for this test. If however, the desired MSBs of the ADC output are not within one bit of the desired MSBs of the test signal (NO), the DAC/ADC pair fail the test as shown at 2018. If desired, the DAC can be paired with another ADC and tested, and similarly the ADC can be paired with another DAC and tested to ascertain which component (the DAC or ADC) may have caused the test failure.

Figure 21:
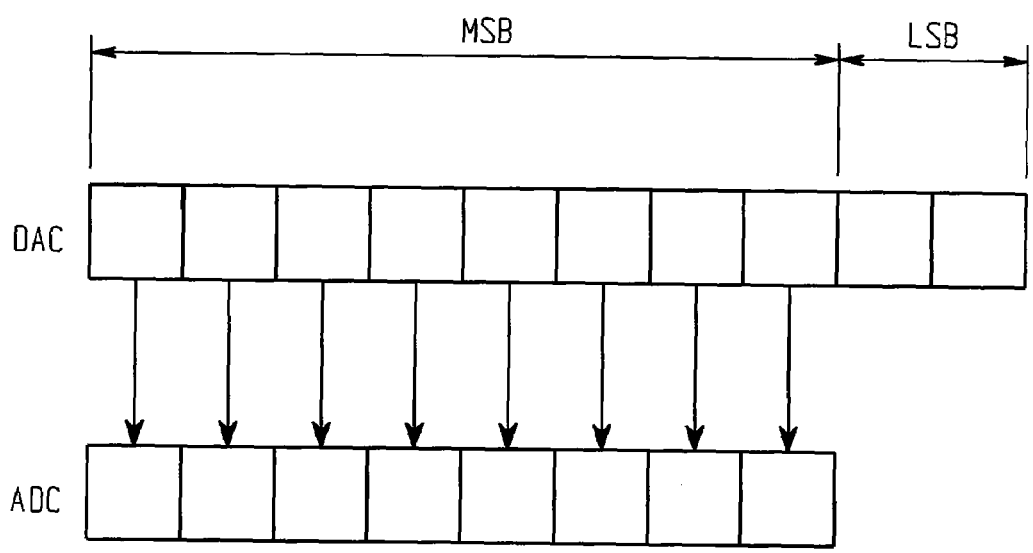
FIG. 21 is an example diagram of a system wherein the ADC has lower resolution than the DAC being employed in the test.

If at 2008 it is determined that the DAC and ADC have different resolutions, at 2020 it is determined whether the MSBs of the ADC output is within 1 bit (LSB) of the corresponding MSBs of the test signal. For example, referring to FIG. 21 while still referring to FIG. 20, if the ADC has a smaller resolution 2104 than the DAC resolution 2102 (which in the example illustrated in FIG. 21 shows the DAC having a 10 bit resolution and the ADC having an 8 bit resolution), then the most significant bits 2106 of the DAC corresponding to the ADC resolution (bits 2104) are compared at 2020. If the value of bits 2104 are not within 1 bit of the MSB 2106 of the test value 2102 input into the DAC (NO), then the DAC/ADC pair failed the test as illustrated at 2022.

In accordance with an aspect of the present invention, the Least Significant Bits (LSBs) of the DAC can be tested even though the ADC has a lower resolution. If the value of the ADC output 2104 is within one bit of the DAC MSBs 2106, (YES) at 2024 the least significant bits (2108) are tested by cycling through all of the values for LSBs once. For example, LSB values of 00, 01, 10, 11 are cycled through LSB 2108 and the ADC output of obtained for each cycle. As shown at 2026, if the value of ADC 2104 only changes once throughout the cycle (YES), the LSB for the DAC/ADC pair have passed as shown at 2028; otherwise, as shown at 2030 the DAC/ADC pair failed the test as shown at 2030. For example, if bits 2104 of ADC are 11110000 at the beginning of the cycle, bits 2104 are evaluated for LSB bit 2108 values of 00, 01, 10, 11. The value of bits 2104 should only change once from 11110000 to 11110001. If the value of bits 2104 change more than once, or by more than one bit, then the DAC/ADC pair fail the test.

Although the test for LSB just described for FIGS. 20 and 21 illustrated two bits, the test can be performed for any reasonable number of LSB. The test can be performed for one LSB, or a plurality of LSBs. Regardless of the number of LSBs, the ADC value should still change only once. However, the reliability of the test for one bit is dependent on the threshold value the ADC uses to round up or down.

Most tests will perform a test of several, if not all values for the DAC/ADC pair. Therefore, after the DAC/ADC complete a test for a first test value, the next test value is selected and the steps starting at 2006 are repeated until all of the test values have been evaluated. After testing is completed, the test bus is coupled to a ground. A controllable switching device can be switched to couple the test bus to ground.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims interpreted in accordance with the breadth to which they are fairly, legally and equitably entitled.

What is claimed is:

1. An apparatus, comprising:
    a digital to analog converter having an input and an output, the digital to analog converter responsive to produce an analog output signal at the output based on a digital signal received at the input;
    a test bus;
    a digital to analog converter pad;
    a first controllable switching device operable to switch the analog output signal to one of the group consisting of the test bus and the digital to analog converter pad;
    an analog to digital converter having an input and an output;
    an analog to digital converter pad;
    a second controllable switching device operable to couple one of the test bus and the analog to digital converter pad to the input of the analog to digital converter; and
    a third controllable switching device coupled between the test bus and a ground, the third controllable switching device responsive to couple the test bus to the ground during a predetermined state.

2. An apparatus according to claim 1, wherein the predetermined state is when no testing is occurring.

3. An apparatus according to claim 1, wherein the test bus is an analog bus.

4. An apparatus according to claim 1, wherein the first controllable switching device and the second controllable switching device are analog multiplexers.

5. An apparatus according to claim 1, further comprising:
    a digital to analog test logic coupled to the digital to analog converter;
    an analog to digital test logic coupled to the analog to digital converter; and a test multiplexer coupled to the digital to analog test logic, analog to digital test logic, the first controllable switching device, and the second controllable switching device;

wherein the test multiplexer is operable to control the operation of the first controllable switching device and the second controllable switching device to couple the output of digital to analog converter and the input of the analog to digital converter to the test bus while a test is being performed.

6. An apparatus according to claim 5, further comprising:
the test multiplexer is operable to receive test data from the digital to analog test logic and forward the test data to the analog to digital test logic; and
the analog to digital test logic is operable to compare the output of the analog to digital converter with the test data.

7. An apparatus according to claim 6, wherein the analog to digital test logic determines the test is successful based on one of the group consisting of the output of the analog to digital converter is equal to the test data, the output of the analog to digital converter is one bit less than the test data, and the output of the analog to digital converter is one bit greater than the test data.

8. An apparatus, comprising:
a digital to analog converter having an input and an output, the digital to analog converter responsive to produce an analog output signal at the output based on a digital signal received at the input;
a test bus;
a digital to analog converter pad;
a first controllable switching device operable to switch the analog output signal to one of the group consisting of the test bus and the digital to analog converter pad;
an analog to digital converter having an input and an output;
an analog to digital converter pad;
a second controllable switching device operable to couple one of the test bus and the analog to digital converter pad to the input of the analog to digital converter;
a second digital to analog converter having input and an output, the digital to analog converter responsive to produce an analog output signal at the output based on a digital signal received at the input;
a second digital to analog converter pad;
a third controllable switching device operable to switch the analog output signal from the second digital to analog converter to one of the group consisting of the test bus and the second digital to analog converter pad;
a second analog to digital converter pad;
a second controllable switching device operable to couple one of the test bus and the analog to digital converter pad to the input of the analog to digital converter;
a second analog to digital converter having an input and an output;
a fourth controllable switching device operable to couple one of the test bus and the second analog to digital converter pad to the input of the second analog to digital converter;
a test multiplexer coupled to the first controllable switching device, the second controllable switching device, the third controllable switching device, and the fourth controllable switching device, wherein the test multiplexer is operable to control the operation of the first controllable switching device, the second controllable switching device, the third controllable switching device and the fourth controllable switching device to route the output of one of the group consisting of the first digital to analog converter and the second digital to analog converter to the test bus, and to route the output of one of the group consisting of the first analog to digital converter and the second analog to digital converter to the test bus while a test is being performed; and
a fifth controllable switching device coupled between the test bus and a ground, wherein the fifth controllable switching device is responsive to signals from the test multiplexer to couple the test bus to ground while in a normal, non-test mode.

9. An apparatus according to claim 8, further comprising:
the test multiplexer is operable to couple not more than one of the group consisting of the first digital to analog converter and the second digital to analog converter to the test bus at any time; and
the test multiplexer is operable to couple not more than one of the group consisting of the first analog to digital converter and the second analog to digital converter to the test bus at any time.

10. An apparatus, comprising:
a digital to analog converter having an input and an output, the digital to analog converter responsive to produce an analog output signal at the output based on a digital signal received at the input;
a test bus;
a digital to analog converter pad;
a first controllable switching device operable to switch the analog output signal to one of the group consisting of the test bus and the digital to analog converter pad;
an analog to digital converter having an input and an output;
an analog to digital converter pad;
a second controllable switching device operable to couple one of the test bus and the analog to digital converter pad to the input of the analog to digital converter;
a second digital to analog converter having input and an output, the digital to analog converter responsive to produce an analog output signal at the output based on a digital signal received at the input;
a second digital to analog converter pad;
a third controllable switching device operable to switch the analog output signal from the second digital to analog converter to one of the group consisting of the test bus and the second digital to analog converter pad;
a second analog to digital converter having an input and an output;
a second analog to digital converter pad;
a fourth controllable switching device operable to couple one of the test bus and the second analog to digital converter pad to the input of the second analog to digital converter;
a first digital to analog test logic associated with the first digital to analog converter;
a first analog to digital test logic associated with the first analog to digital converter;
a second digital to analog test logic associated with the second digital to analog converter;
a second analog to digital test logic associated with the second analog to digital converter; and
a test multiplexer coupled to the first digital to analog test logic, second digital to analog test logic, first analog to digital test logic, second analog to digital test logic, the first controllable switching device, and the second controllable switching device, the third controllable switching device, wherein the test multiplexer is operable to control the operation of the first controllable switching device, the second controllable switching device, the third controllable switching device and the fourth controllable switching device to couple a selected one of the group consisting of the output of the first digital to analog converter and the output of the second digital to analog converter to the test bus and to couple a selected one of the group consisting of the input of the first analog to digital converter and the input of the second analog to digital converter to the test bus while a test is being performed.

11. An apparatus according to claim 10, further comprising:
the test multiplexer is operable to receive test data from the test logic associated with the selected one of the group consisting of the first digital to analog converter and the second digital to analog converter and forward the test data to the test logic associated with the selected one of the group consisting of the first analog to digital converter and the second analog to digital converter; and
wherein the test logic is operable to compare the output of selected one of the group consisting of the first analog to digital converter and the second analog to digital converter with the test data.

12. An apparatus according to claim 11, wherein the analog to digital test logic determines a test is successful based on one of the group consisting of the output of the selected one of the group consisting of the first analog to digital converter and the second analog to digital converter is equal to the test data, the output of the selected one of the group consisting of the first analog to digital converter and the second analog to digital converter is one bit less than the test data, and the output of selected one of the group consisting of the first analog to digital converter and the second analog to digital converter is one bit greater than the test data.

13. An apparatus according to claim 11, further comprising the associated analog to digital test logic selects a predetermined number of most significant bits from the test data and compares them to corresponding most significant bits from the output of the selected one of the group consisting of the first analog to digital converter and the second analog to digital converter.

14. An apparatus according to claim 13, the associated analog to digital test logic is configured to cycle through least significant bits lower than the predetermined number of most significant bits, wherein the associated analog to digital test logic determines the test is successful based on the predetermined number of most significant bits of the output of the selected one of the group consisting of the first analog to digital converter and the second analog to digital converter changing by not more than one bit throughout the cycle.

15. An apparatus, comprising
a plurality of digital to analog converters;
a plurality of analog to digital converts;
a test bus;
means for coupling not more than one of the plurality of digital to analog converters to not more than one of the plurality of analog to digital converters via the test bus;
means for applying a test signal to the one of the plurality of digital to analog converters;
means for comparing an output from the not more than one of the analog to digital converters with the test signal; and
means for coupling the test bus to a ground when no testing is in progress.

16. An apparatus according to claim 15, wherein the means for comparing determines a successful test based on one of the group consisting of output from the not more than one of the analog to digital converters equals the test signal, the output from the not more than one of the analog to digital converters is not more than one least significant bit less than the test signal, and the output from the not more than one of the analog to digital converters is not more than one least significant bit than the test signal.

17. An apparatus, comprising:
a plurality of digital to analog converters;
a plurality of analog to digital converts;
a test bus;
means for coupling not more than one of the plurality of digital to analog converters to not more than one of the plurality of analog to digital converters via the test bus;
means for applying a test signal to one of the plurality of digital to analog converters; and
means for comparing an output from the one of the analog to digital converters with the test signal,
wherein the means for comparing compares a predetermined number of most significant digits from the output from the not more than one of the analog to digital converters with the test signal, and the means for comparing cycles through all of the least significant bits that are not in the predetermined number of most significant bits and determines a test is successful based on the predetermined number of most significant bits of the output of the selected one of the group consisting of the first analog to digital converter and the second analog to digital converter changing by not more than one bit throughout the cycle.

18. A method, comprising
coupling a one of a plurality of digital to analog converters a one of a plurality of analog to digital converters via a test bus;
applying a test signal to the one of the plurality of digital to analog converters;
comparing an output from the one of the analog to digital converters with the test signal; and
coupling the test bus to a ground when no testing is in progress.

19. A method according to claim 18, further comprising determining a test is successful responsive to the comparing determining one of the group consisting of the output from the not more than one analog to digital converter equals the test signal, the output from the not more than one analog to digital converter is not more than one least significant bit less than the test signal, and the output from the not more than one analog to digital converters is not more than one least significant bit less than the test signal.

20. A method, comprising:
coupling a one of a plurality of digital to analog converters to a one of a plurality of analog to digital converters via a test bus;
applying a test signal to the one of the plurality of digital to analog converters; and
comparing an output from the one of the analog to digital converters with the test signal,
wherein the means for comparing compares a predetermined number of most significant digits from the output from the not more than one of the analog to digital converters with the test signal, and the means for comparing cycles through all of the least significant bits that are not in the predetermined number of most significant bits and determines a test is successful based on the predetermined number of most significant bits of the output of the selected one of the group consisting of the first analog to digital converter and the second analog to digital converter changing by not more than one bit throughout the cycle.

* * * * *